US011456218B2

(12) United States Patent
Wang et al.

(10) Patent No.: US 11,456,218 B2
(45) Date of Patent: Sep. 27, 2022

(54) SEMICONDUCTOR DEVICE AND METHOD FOR MANUFACTURING THE SAME

(71) Applicant: Institute of Microelectronics, Chinese Academy of Sciences, Beijing (CN)

(72) Inventors: Guilei Wang, Beijing (CN); Henry H Radamson, Beijing (CN); Zhenzhen Kong, Beijing (CN); Junjie Li, Beijing (CN); Jinbiao Liu, Beijing (CN); Junfeng Li, Beijing (CN); Huaxiang Yin, Beijing (CN)

(73) Assignee: Institute of Microelectronics, Chinese Academy of Sciences

( * ) Notice: Subject to any disclaimer, the term of this patent is extended or adjusted under 35 U.S.C. 154(b) by 107 days.

(21) Appl. No.: 17/004,173

(22) Filed: Aug. 27, 2020

(65) Prior Publication Data

US 2021/0384080 A1    Dec. 9, 2021

(30) Foreign Application Priority Data

Jun. 3, 2020  (CN) .......................... 202010494852.6
Jun. 3, 2020  (CN) .......................... 202010495562.3

(51) Int. Cl.
*H01L 21/8234* (2006.01)
*H01L 29/66* (2006.01)
(Continued)

(52) U.S. Cl.
CPC ............... *H01L 21/823487* (2013.01); *H01L 21/823481* (2013.01); *H01L 21/823878* (2013.01);
(Continued)

(58) Field of Classification Search
CPC ..... H01L 21/823487; H01L 21/823481; H01L 21/823878; H01L 21/823885; H01L 21/76224; H01L 27/088; H01L 27/092; H01L 27/2454; H01L 29/66666; H01L 29/7827; H01L 29/4236; H01L 29/66787; H01L 29/1037
See application file for complete search history.

(56) References Cited

U.S. PATENT DOCUMENTS 5,140,388 A *  8/1992  Bartelink ............ H01L 29/7827
                                                        257/369
6,773,994 B2 *  8/2004  Chittipeddi ..... H01L 21/823885
                                                        438/269
(Continued)

*Primary Examiner* — Michael M Trinh
(74) *Attorney, Agent, or Firm* — Goodwin Procter, LLP

(57) ABSTRACT

A semiconductor device and a method for manufacturing the semiconductor device. Multiple stacks and an isolation structure among the multiple stacks are formed on a substrate. Each stack includes a first doping layer, a channel layer and a second doping layer. For each stack, the channel layer is laterally etched from at least one sidewall of said stack to form a cavity located between the first doping layer and the second doping layer, and a gate dielectric layer and a gate layer are formed in the cavity. A first sidewall of each stack is contact with the isolation structure, and the at least one sidewall does not include the first side wall. Costly high-precision etching is not necessary, and therefore a device with a small size and a high performance can be achieved with a simple process and a low cost. Diversified device structures can be provided on requirement.

16 Claims, 25 Drawing Sheets

(51) Int. Cl.
*H01L 21/8238* (2006.01)
*H01L 29/423* (2006.01)
*H01L 27/088* (2006.01)
*H01L 29/78* (2006.01)

(52) U.S. Cl.
CPC ........ *H01L 27/088* (2013.01); *H01L 29/4236* (2013.01); *H01L 29/66666* (2013.01); *H01L 29/7827* (2013.01); H01L 21/823885 (2013.01)

(56) References Cited

U.S. PATENT DOCUMENTS

| | | | |
|---|---|---|---|
| 11,158,547 B2 * | 10/2021 | Zhu | H01L 29/66522 |
| 11,164,942 B1 * | 11/2021 | Weckx | H01L 29/775 |
| 11,177,372 B2 * | 11/2021 | Balakrishnan | H01L 29/785 |
| 11,222,981 B2 * | 1/2022 | Zhou | H01L 27/092 |

* cited by examiner

SEMICONDUCTOR DEVICE AND METHOD FOR MANUFACTURING THE SAME

The present disclosure claims the priority to Chinese Patent Application No. 202010494852.6, titled "SEMICONDUCTOR DEVICE AND METHOD FOR MANUFACTURING THE SAME", filed on Jun. 3, 2020 with the China National Intellectual Property Administration, and Chinese Patent Application No. 202010495562.3, titled "SEMICONDUCTOR DEVICE AND METHOD FOR MANUFACTURING THE SAME", filed on Jun. 3, 2020 with the China National Intellectual Property Administration, the content of which is incorporated herein by reference.

FIELD

The present disclosure relates to the field of semiconductor device and manufacture thereof, and in particular to a semiconductor device and a method for manufacturing the semiconductor device.

BACKGROUND

Semiconductor devices are increasingly miniaturized and integrated with evolution of semiconductor manufacture technology. The process node may reach a limit when being scaled down, where it is difficult to further miniaturize the semiconductor device and improve performances thereof. An important issue in the field of semiconductor devices is how to acquire a device with both a small size and a high performance.

SUMMARY

In view of the above, an object of the present disclosure is to provide a semiconductor device and a method for manufacturing the semiconductor device, so as to achieve a small device with both a high performance and a small size.

In order to achieve the above object, technical solutions are provided as follows according to embodiments of the present disclosure.

A method for manufacturing a semiconductor device is provided according to an embodiment of the present disclosure. The method includes: forming, on a substrate, multiple stacks and an isolation structure among the multiple stacks. Each stack includes a first doping layer, a second doping layer, and a channel layer located between the first doping layer and the second doping layer. The method further includes: for each stack, etching the channel layer laterally from at least one sidewall of said stack, to form a cavity located between the first doping layer and the second doping layer, and forming a gate dielectric layer and a gate layer in the cavity. A first sidewall of said stack is contact with the isolation structure, the at least one sidewall does not include the first side wall, and a part of the channel layer remains at the first sidewall of said stack after the etching.

In an embodiment, forming the multiple stacks and the isolation structure among the multiple stacks on the substrate includes: forming, on the substrate, a first doping material layer, a second doping layer material, and a channel material layer located between the first doping material layer and the second doping material layer; etching the first doping material layer, the channel material layer, and the second doping material layer, to form a first trench; and forming the isolation structure in the first trench.

In an embodiment, etching the channel layer laterally includes: etching the first doping material layer, the channel material layer and the second doping material layer, to form a second trench, where the second trench exposes the at least one sidewall of said stack; and etching the channel layer laterally via the second trench.

In an embodiment, after forming the gate dielectric layer and the gate layer in the cavity, the method further includes: filling the second trench with a dielectric material.

In an embodiment, forming the multiple stacks and the isolation structure among the multiple stacks on the substrate includes: forming a dielectric layer on the substrate; forming, in the dielectric layer, multiple through holes that run vertically through the dielectric layer; and forming a stack in each through hole. The dielectric layer serves as the isolation structure among the multiple stacks. The multiple stacks include at least a first stack and a second stack. The first stack and the second stack are different in material.

In an embodiment, etching the channel layer laterally includes: etching the dielectric layer to form a third trench, where the third trench exposes the at least one sidewall of said stack; and etching the channel layer laterally via the third trench.

In an embodiment, after forming the gate dielectric layer and the gate layer in the cavity, the method further includes: filling the third trench with a dielectric material, where the dielectric material corresponds to said stack.

In an embodiment, the second trench is formed and another isolation structure is formed in the second trench, before the first trench is formed. The another isolation structure is removed from the second trench after forming the isolation structure in the first trench.

In an embodiment, the second trench divides the first doping material layer, the channel material layer, and the second doping material layer into multiple separate structures. Each separate structure is divided into multiple portions by the first trench.

In an embodiment, one of the multiple separate structures is divided into the multiple portions by multiple sub-trenches of the first trench, where the multiple sub-trenches intersect with each other.

In an embodiment, etching the channel layer laterally includes performing multiple oxidation-removal processes. Each oxidation-removal process includes: oxidizing the channel layer, to form an oxide layer on an exposed surface of the channel layer; and removing the oxide layer.

In an embodiment, for each stack, the first doping layer, the channel layer and the second doping layer are made of: SiGe, Si, SiGe, respectively; Si, SiGe, Si, respectively; or Ge, GeSn, Ge, respectively.

In an embodiment, a buffer layer is formed between the substrate and the multiple stacks.

In an embodiment, an intrinsic layer corresponding to a material of the first doping layer is formed between the first doping layer and the channel layer, and an intrinsic layer corresponding to a material of the second doping layer is formed between the channel layer and the second doping layer.

In an embodiment, the channel layers in the multiple stacks are made of a same material. The isolation structure includes a strain material layer, and the strain material layer is configured to provide compressive stress or tensile stress for the channel layer of each stack.

In an embodiment, the channel layers in the multiple stacks are made of multiple materials. The isolation structure includes multiple strain material layers, and the multiple strain layers are configured to provide compressive stress or tensile stress for the multiple materials, respectively.

In an embodiment, forming the gate dielectric layer and the gate layer in the cavity includes: depositing the gate dielectric layer and the gate layer, and removing the gate dielectric layer and the gate layer that are located outside the cavity.

A semiconductor device is further provided according to an embodiment of the present disclosure. The semiconductor device includes a substrate, multiple stacks on the substrate, and an isolation structure among the multiple stacks. Each stack includes a first doping layer, a second doping layer, and a channel layer located between the first doping layer and the second doping layer. A cavity is located between the first doping layer and the second doping layer, at at least one sidewall of each stack. A first sidewall of each stack is contact with the isolation structure, the at least one sidewall does not include the first side wall, and the cavity is filled with a gate dielectric layer and a gate layer.

In an embodiment, the semiconductor device includes stacked layers located on the substrate, and the stacked layers include a first doping material layer, a second doping material layer, and a channel material layer located between the first doping material layer and the second doping material layer. The stacked layers are provided with a first trench and a second trench, and the first trench is filled with the isolation structure. The first doping material layer, the channel material layer, and the second doping material layer are divided by the first trench into the first doping layers, the channel layers, and the second doping layers, respectively, in the multiple stacks. The at least one sidewall of each stack is adjacent to the second trench.

In an embodiment, the semiconductor device further includes a dielectric material layer located on the substrate. The multiple stacks include at least a first stack and a second stack. The first stack and the second stack are located in a first through hole and a second through hole, respectively, of the dielectric material layer. The first stack and the second stack are different in material. The dielectric material layer serves as the isolation structure.

In an embodiment, the isolation structure is made of an insulating material.

The semiconductor device and the method for manufacturing the semiconductor device are provided according to embodiments of the present disclosure. The multiple stacks and the isolation structure among the multiple stacks are formed on the substrate. Each stack includes the first doping layer, the channel layer and the second doping layer. For each stack, the channel layer is laterally etched from the at least one sidewall of said stack, to form a cavity located between the first doping layer and the second doping layer, and a gate dielectric layer and a gate layer are formed in the cavity. A first sidewall of said stack is contact with the isolation structure, and the at least one sidewall does not include the first side wall. Thereby, a source and a drain are horizontal film layers parallel to a surface of the substrate, and the channel layer remaining on a sidewall of the isolation structure serves as a vertical channel between the source and the drain. Costly high-precision etching is not necessary, and therefore a device with a small size and a high performance can be achieved with a simple process and a low cost. In addition, the substrate may be provided with the first stack and the second stack that are different in material, and hence the manufactured semiconductor device may include a first device and a second device that are different in material. Diversified device structures can be provided on requirement.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below show merely the embodiments of the present disclosure, and those skilled in the art may obtain other drawings according to the provided drawings without any creative effort.

DETAILED DESCRIPTION OF EMBODIMENTS

Figure 1:
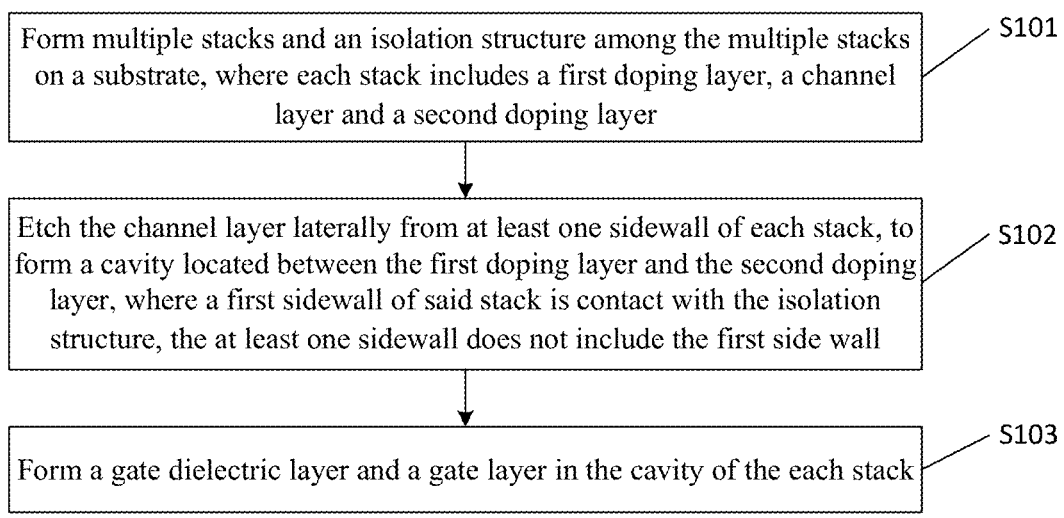
FIG. 1 is a flowchart of a method for manufacturing a semiconductor device according to an embodiment of the present disclosure.

To make the aforementioned objects, features and advantages of the present disclosure clearer, hereinafter embodiments of the present disclosure are described in detail in conjunction with the drawings.

Various details are illustrated in the description to help understand the present disclosure. The present disclosure may be implemented in other embodiments besides those described herein. Those skilled in the art may analogize without departing from the spirit of the present disclosure. Therefore, the present disclosure is not limited to embodiments described as follows.

Moreover, embodiments of the present disclosure are described in detail in conjunction with schematic diagrams. To facilitate illustration, a device structure may not be enlarged strictly in proportion in a cross-sectional view. The schematic diagrams are exemplary and should not be construed as limitations on the protection scope of the present disclosure. Practical manufacture concerns spatial sizes in three dimensions, such as a length, a width and a depth.

As described in the background, semiconductor devices are increasingly miniaturized and integrated with evolution of semiconductor manufacture technology. The process node may reach a limit when being scaled down, where it is difficult to further miniaturize the semiconductor device and improve performances thereof. An important issue in the field of semiconductor devices is how to acquire a device with both a small size and a high performance.

For example, a storage layer and a gate layer may be formed on a substrate, and a source and a drain are formed by doping the substrate at two sides of the gate layer. Thereby, a channel layer between the source and the drain is limited by a dimension of the gate layer. The dimension of the gate layer is limited by a photolithography technique. Hence, an overall dimension of the device is limited.

In order to address the above technical issue, a semiconductor device and a method for manufacturing the semiconductor device are provided according to embodiments of the present disclosure. Multiple stacks and an isolation structure among the multiple stacks are formed on the substrate. Each stack includes a first doping layer, a channel layer and a second doping layer. For each stack, a channel layer is laterally etched from at least one sidewall of said stack, to form a cavity located between the first doping layer and the second doping layer, and a gate dielectric layer and a gate layer are formed in the cavity. A first sidewall of said stack is contact with the isolation structure, and the at least one sidewall does not include the first side wall. Thereby, a source and a drain are horizontal film layers parallel to a surface of the substrate, and the channel layer remaining on a sidewall of the isolation structure serves as a vertical channel between the source and the drain. Costly high-precision etching is not necessary, and therefore a device with a small size and a high performance can be achieved with a simple process and a low cost. In addition, the substrate may be provided with a first stack and a second stack that are different in material, and hence a manufactured semiconductor device may include a first device and a second device that are different in material. Diversified device structures can be provided on requirement.

Reference is made to FIG. 1, which is a flowchart of a method for manufacturing a semiconductor device according to an embodiment of the present disclosure. The method may include following steps S101 to S103.

In step S101, multiple stacks and an isolation structure among the multiple stacks are formed on a substrate. Each stack includes a first doping layer, a second doping layer, and a channel layer located between the first doping layer and the second doping layer.

In step S102, the channel layer of each stack is etched laterally from at least one sidewall of said stack, to form a cavity located between the first doping layer and the second doping layer. A first sidewall of said stack is contact with the isolation structure, and the at least one sidewall does not include the first side wall. A part of the channel layer remains at the first sidewall of said stack after the etching.

In step S103, a gate dielectric layer and a gate layer are formed in the cavity for each stack.

In one embodiment, the multiple stacks on the substrate may be same in material. Therefore, the multiple stacks may be manufactured from a same material layer. In one embodiment, the step S101 may include following steps S1011 to S1013.

In step S1011, a first doping material layer, a channel material layer and a second doping material layer are formed on the substrate.

In step S1012, the first doping material layer, the channel material layer, and the second doping material layer are etched to form a first trench.

In step S1013, the isolation structure is formed in the first trench.

Correspondingly, the channel layers in different stacks may be etched in a same process. In one embodiment, the step S102 may include the following steps S1021 and S1022.

In step S1021, the first doping material layer, the channel material layer and the second doping material layer are etched to form a second trench. The second trench exposes the at least one sidewall of said stack.

In step S1022, the channel layer is laterally etched via the second trench.

Figure 2:
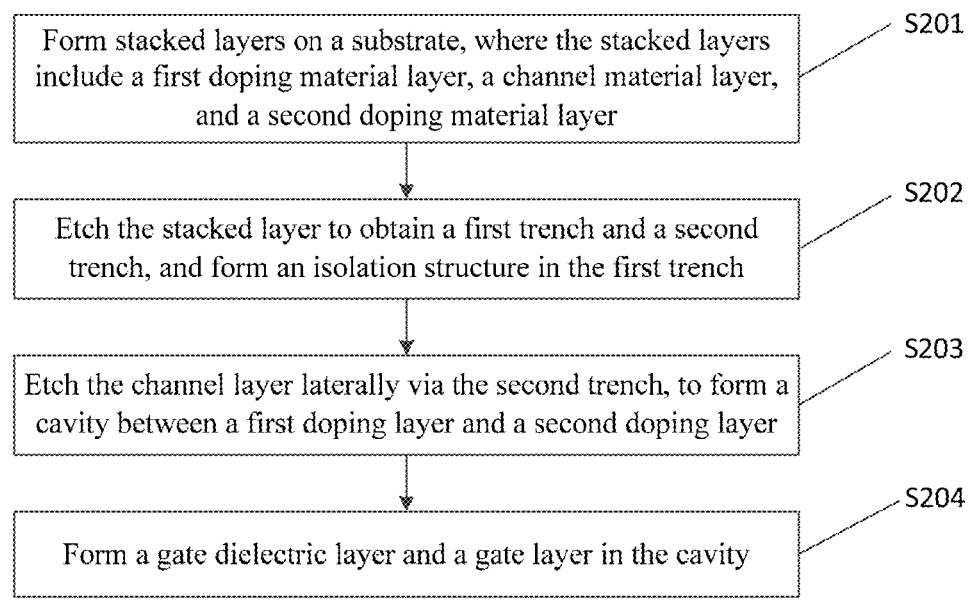
FIG. 2 is a flowchart of another method for manufacturing a semiconductor device according to an embodiment of the present disclosure.

On a basis of the above embodiment, reference is made to FIG. 2, which is a flowchart of another method for manufacturing a semiconductor device according to an embodiment of the present disclosure. The method may include following steps S201 to S204.

Figure 4:
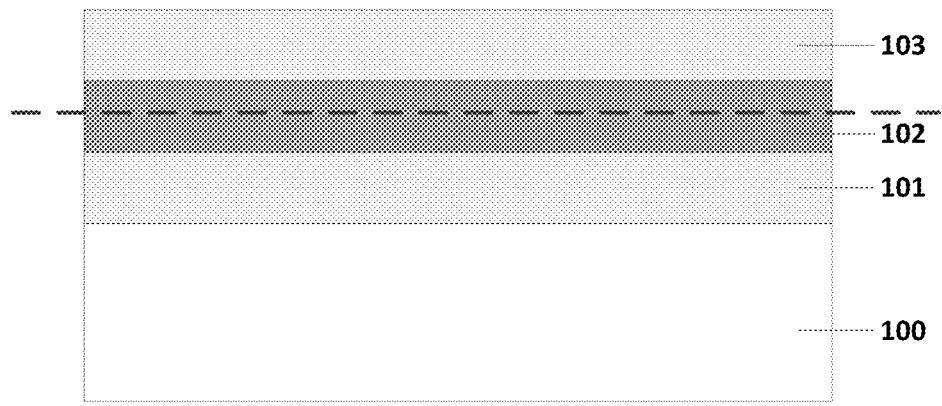
FIG. 4 to FIG. 19 are schematic diagrams of structures in a process of manufacturing a semiconductor device according to an embodiment of the present disclosure.
Figure 5:
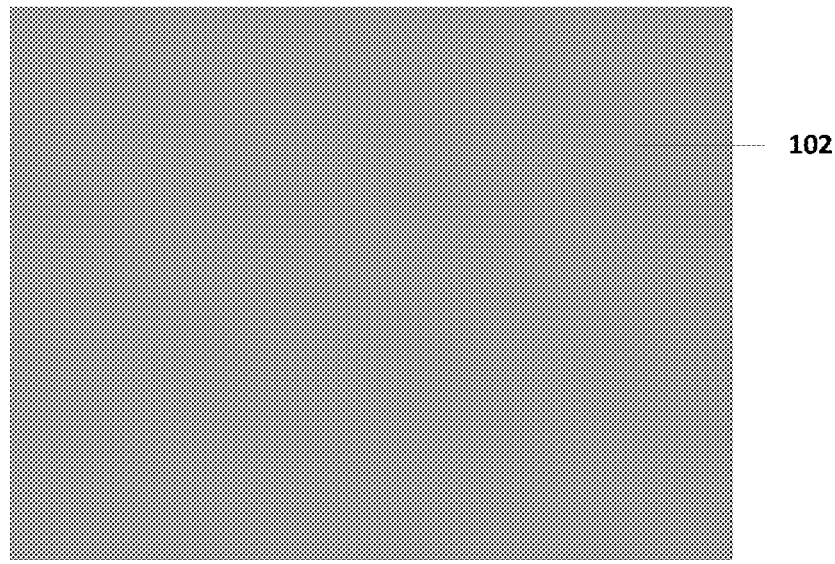

In step S201, stacked layers are formed on a substrate 100. The stacked layers include a first doping material layer 101a, a channel material layer 102a, and a second doping material layer 103a. Reference is made to FIG. 4 and FIG. 5.

In one embodiment, the substrate 100 may be made of Si, Ge, SiGe, silicon on insulator (SOI), germanium on insulator (GOI), a III-V compound semiconductor, a II-IV compound semiconductor, or the like. In another embodiment, the substrate 100 may include another elementary semiconductor, another compound semiconductor (such as GaAs, InP or SiC), a stacked structure (such as Si/SiGe), or another epitaxial structure (such as a germanium silicon on insulator (SGOI)). In this embodiment, the substrate 100 may be a bulk silicon substrate.

In this embodiment, the stacked layers may be formed on the substrate 100. The stacked layers may include the first doping material layer 101a, a channel material layer 102a and a second doping material layer 103a, as shown in FIG. 4 and FIG. 5. FIG. 4 is a schematic diagram of a structure in a process of manufacturing a semiconductor device according to an embodiment of the present disclosure. FIG. 5 is a schematic diagram of a cross section along a horizontal plane indicated by a dashed line in FIG. 4. The first doping material layer 101a and the second doping material layer 103a may serve as a source and a drain. That is, one of the two layers serves as the source, and the other serves as the drain. Materials of the first doping material layer 101a, the channel material layer 102a, and the second doping material layer 103a may be determined according to a practical situation.

In one embodiment, the substrate 100 is a silicon substrate, and the first doping material layer 101a, the channel material layer 102a, and the second doping material layer 103a may be made of SiGe, Si, and SiGe, respectively. Namely, SiGe serves as the source and the drain, and Si serves as a channel. In such case, the first doping material layer 101a and the silicon substrate have similar lattice constants, thereby facilitating forming the first doping material layer 101a with good quality.

In one embodiment, the substrate 100 is a silicon substrate, and the first doping material layer 101a, the channel material layer 102a, and the second doping material layer 103a may be made of Si, SiGe, and Si, respectively. Namely, Si serves as the source and the drain, and SiGe serves as a channel. In such case, the first doping material layer 101a and the silicon substrate are made of the same material, thereby facilitating forming the first doping material layer 101a with good quality. Electron mobility of Si is approximately 1600 $cm^2V^{-1}\ s^{-1}$ and hole mobility of Si is approximately 430 $cm^2V^{-1}\ s^{-1}$. Electron mobility of Ge is approximately 3900 $cm^2V^{-1}\ s^{-1}$ and hole mobility of Ge is approximately 1900 $cm^2V^{-1}\ s^{-1}$. Hence, carrier mobility of SiGe is higher than that of Si, and therefore a device made of SiGe may have a good performance.

In one embodiment, the substrate 100 is a silicon substrate, and the first doping material layer 101a, the channel material layer 102a, and the second doping material layer 103a may be made of Ge, GeSn, and Ge, respectively. Namely, Ge serves as the source and the drain, and GeSn serves as a channel. In such case, the first doping material layer 101a differs a bit from the silicon substrate in lattice, and therefore a buffer layer may be formed between the first doping material layer 101a and the silicon substrate. The buffer layer may be a Ge layer formed in low temperature, or a stack of a Ge layer formed in low temperature and a Ge layer formed in high temperature. The buffer layer is configured to match the first doping material layer 101a with the silicon substrate in lattice constants, such that the first doping material layer 101a is formed with good quality. Carrier mobility of Ge is higher than that of Si, carrier mobility of Sn is also high, and therefore a device made of Ge and GeSn may have a good performance.

It is appreciated that the first doping material layer 101a, the channel material layer 102a, and the second doping material layer 103a may be made of other materials such as GaAs, InAs, InAb, or a III-V compound. These materials have higher carrier mobility, which is beneficial for a high performance of the device. Those skilled in the art may select proper materials for the first doping material layer 101a, the channel material layer 102a, and the second doping material layer 103a according to a practical situation.

Thicknesses of the first doping material layer 101a, the channel material layer 102a, and the second doping material layer 103a may range from 10 nm to 30 nm. The first doping material layer 101a and the second doping material layer 103a are doped, and the doping of the two may be of a same type. The doping may be in-situ doping, or of another type. A first diffusion barrier layer may be formed between the first doping material layer 101a and the channel material layer 102a. The first diffusion barrier layer may be an intrinsic layer corresponding to a material of the first doping material layer, and is configured to prevent dopants in the first doping material layer 101a from diffusing into the channel layer 102. Similarly, a second diffusion barrier layer may be formed between the channel material layer 102a and the second doping material layer 103a. The second diffusion barrier layer may be an intrinsic layer corresponding to a material of the second doping material layer 103a, and is configured to prevent dopants in the second doping material layer 103a from diffusing into the channel layer 102.

As an example, the stacked layers may include a first doped Si layer, a first intrinsic Si layer, a silicon germanium layer, a second intrinsic Si layer, and a second doped Si layer. The intrinsic Si layers may serve as the diffusion barrier layers. As another example, the stacked layers may include a first doped SiGe layer, a first intrinsic SiGe layer, a Si layer, a second intrinsic SiGe layer, and a second doped SiGe layer. The intrinsic SiGe layers serve as the diffusion barrier layers. As another example, the stacked layers may include a first doped Ge layer, a first intrinsic Ge layer, a Ge layer, a second intrinsic Ge layer and a second doped Ge layer.

The first doping material layer 101a, the channel material layer 102a, and the second doping material layer 103a may be formed through epitaxy, such as chemical vapor deposition (CVD), molecular beam epitaxy (MBE), or atomic layer deposition (ALD).

In one embodiment, the Si material may be epitaxied from a silicon-based precursor, under a temperature ranging from 500° C. to 700° C. and a pressure ranging from 10 Torr to 20 Torr, for a period ranging from 20 s to 240 s. The silicon-based precursor may be $Si_2H_2Cl_2$ with a flow rate ranging from 20 sccm to 500 sccm, or $SiH_4$ with a flow rate ranging from 20 sccm to 300 sccm, or a mixed gas of $Si_2H_6$ and $H_2$ with a flow rate ranging from 20 sccm to 300 sccm. In a case that the epitaxied Si serves as a source or a drain, the Si material may be epitaxied under in-situ doping. A dopant may be provided in a doping gas, which is injected into a reactor chamber in conjunction with the silicon-based precursor. The doping gas may be a mixed gas of $PH_3$ and $H_2$ or a mixed gas of $AsH_3$ and $H_2$.

In one embodiment, the SiGe material may be epitaxied from a silicon-based precursor and a germanium-based precursor, under a temperature ranging from 500° C. to 700° C. and a pressure ranging from 10 Torr to 20 Torr, for a period ranging from 20 s to 240 s. The silicon-based precursor may be $Si_2H_2Cl_2$ with a flow rate ranging from 20 sccm to 500 sccm, or $SiH_4$ with a flow rate ranging from 20 sccm to 300 sccm, or a mixed gas of $Si_2H_6$ and $H_2$ with a flow rate ranging from 20 sccm to 300 sccm. The germanium-based precursor may be a mixed gas of $GeH_4$ and $H_2$ or a mixed gas of $Ge_2H_6$ and $H_2$, with a flow rate ranging from 20 sccm to 1000 sccm. In a case that the epitaxied SiGe serves as a source or a drain, the SiGe material may be epitaxied under in-situ doping. A dopant may be provided in a doping gas, which is injected into a reactor chamber in conjunction with the silicon-based precursor and the germanium-based precursor. The doping gas may be a mixed gas of $PH_3$ and $H_2$ or a mixed gas of $AsH_3$ and $H_2$.

In one embodiment, the Ge material may be epitaxied from a germanium-based precursor, under a temperature ranging from 350° C. to 700° C. and a pressure ranging from 10 Torr to 20 Torr, for a period ranging from 20 s to 240 s. The germanium-based precursor may be a mixed gas of $GeH_4$ and $H_2$ or a mixed gas of $Ge_2H_6$ and $H_2$, with a flow rate ranging from 20 sccm to 1000 sccm. In a case that the epitaxied Ge serves as a source or a drain, the Ge material may be epitaxied under in-situ doping. A dopant may be provided in a doping gas, which is injected into a reactor chamber in conjunction with the silicon-based precursor. The doping gas may be a mixed gas of $PH_3$ and $H_2$ or a mixed gas of $AsH_3$ and $H_2$.

In one embodiment, the GeSn material may be epitaxied from a germanium-based precursor and a tin-based precursor, under a temperature ranging from 250° C. to 400° C. and a pressure ranging from 10 Torr to 20 Torr, for a period ranging from 20 s to 240 s. The tin-based precursor may be $SnCl_4$ (carried by $H_2$), with a flow rate ranging from 20 sccm to 500 sccm. The germanium-based precursor may be a mixed gas of $GeH_4$ and $H_2$ or a mixed gas of $Ge_2H_6$ and $H_2$, with a flow rate ranging from 20 sccm to 1000 sccm. In a case that the epitaxied GeSn serves as a source or a drain, the GeSn material may be epitaxied under in-situ doping. A dopant may be provided in a doping gas, which is injected into a reactor chamber in conjunction with the silicon-based precursor. The doping gas may be a mixed gas of $PH_3$ and $H_2$ or a mixed gas of $AsH_3$ and $H_2$.

A concentration of Ge in the SiGe layer may be determined according to a practical situation, and may be less than or equal to 30% given carrier mobility in the SiGe layer and lattice constants of SiGe and Si. A concentration of Sn in the GeSn layer may be determined according to a practical situation, and may be range from 0.5% to 20% given carrier mobility in the GeSn layer and lattice constants of GeSn and Ge. Dopant concentration in the source and the drain may range from $1\times10^{19}$ cm$^{-3}$ to $3\times10^{20}$ cm$^{-3}$. Thicknesses of the first doping material layer 101a, the second doping layer material 103a, and the channel material layer 102a in the device may be determined according to a practical situation, for example, may range from 10 nm to 30 nm. A diffusion barrier layer may be formed between the source and the channel, or formed between the channel and the drain. A thickness of the diffusion barrier layer may range from 1 nm to 5 nm. Generally, the diffusion barrier layer is an intrinsic layer formed by cutting off the doping gas after forming the first doping material layer 101a, or the diffusion barrier layer is an intrinsic layer formed without injecting the doping gas before forming the second doping layer material 103a.

In one embodiment, multiple groups of the stacked layers may be formed on the substrate 100. Each group may include the first doping material layer 101*a*, the channel material layer 102*a* and the second doping layer material 103*a* that are stacked in a vertical direction. The multiple stacked layers may be separated from each other by an insulation material. An integration level of the device is improved in this embodiment.

In step S202, the stacked layers are etched to obtain a first trench 104 and a second trench 110, and an isolation structure 105 is formed in the first trench 104. Reference is made to FIG. 6 to FIG. 13.

The stacked layers including the first doping material layer 101*a*, the channel material layer 102*a* and the second doping layer material 103*a* may be etched after being formed, to obtain the first trench 104 and the second trench 110. In one embodiment, the second trench 110 may divide the stacked layers in which multiple devices are located. That is, the second trench 110 may divide the stacked layers into multiple separate structures. The first trench 104 may be formed with the separate structures that are separated by the second trench 110. The separate structure refers to a separate stack, and each separate stack includes a first doping layer 101, a channel layer 102 and a second doping layer 103. The first doping layer 101, the channel layer 102, and the second doping layer 103 in each separate stack are formed from the first doping material layer 101*a*, the channel material layer 102*a*, and the second doping layer material 103*a*, respectively, which are divided by the second trench.

Figure 12:
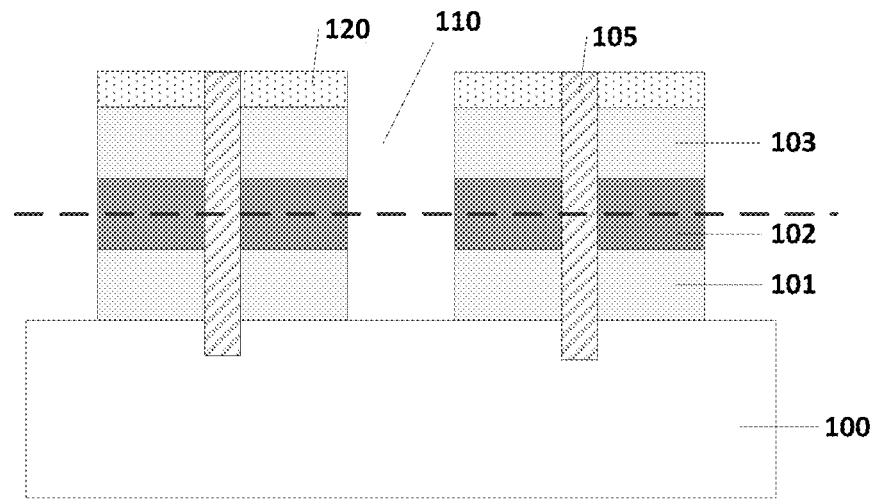
Figure 13:
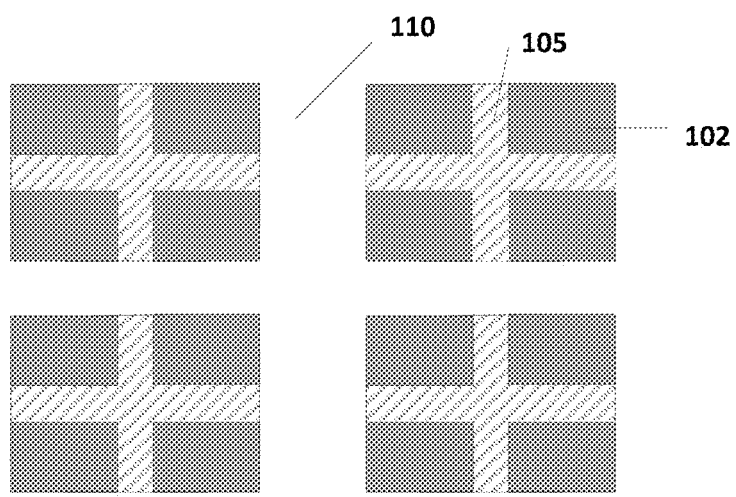

Reference is made to FIG. 12 and FIG. 13. FIG. 12 is a schematic diagram of a structure in a process of manufacturing a semiconductor device according to an embodiment of the present disclosure. FIG. 13 is a schematic diagram of a cross-section along a horizontal plane indicated by a dashed line in FIG. 12. The second trench 110 may divide the stacked layers into four separate structures.

The first trench 104 may be formed in each of the multiple separate structures separated by the second trench 110. Alternatively, the first trench 104 may be formed in one or more of the multiple separate structures separated by the second trench 110. At least one sub-trench of the first trench 104 may be formed within the separate structure, so as to divide a single separate structure into multiple portions. Thereby, a quantity of devices that can be formed in the stacked layers is increased. A sub-trench of the first trench 104 may be parallel with at least one sub-trench of the second trench 110, or may be configured in another direction.

Figure 9:
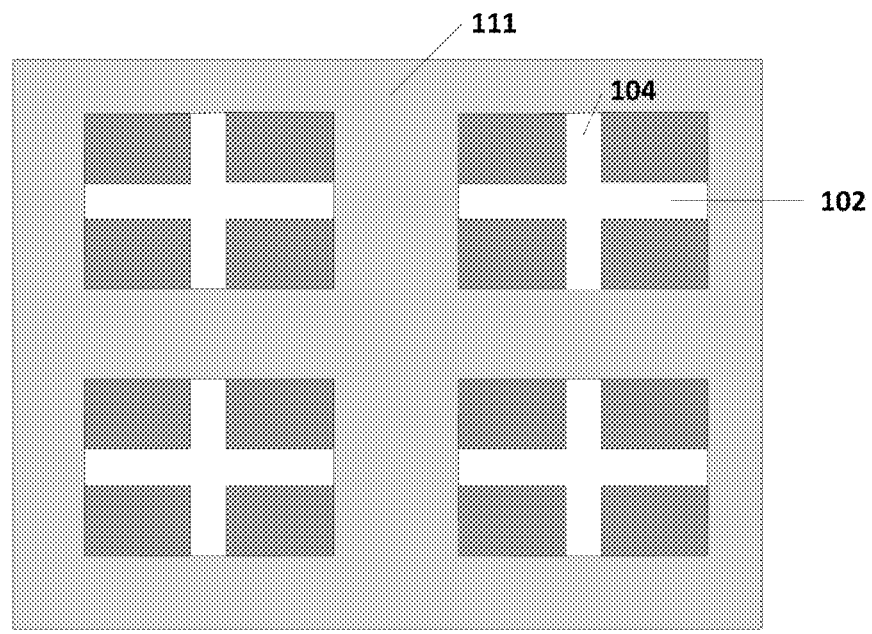

In a case that multiple sub-trenches of the first trench 104 are formed within a single separate structure, the multiple sub-trenches of the first trench 104 may or may not intersect with each other. As shown in FIG. 9, each separate structure is divided into four parts by two intersecting sub-trenches of first trench 104. That is, the structure shown in FIG. 9 includes sixteen separate portions, and thereby sixteen separate devices may be formed, achieving a high level of integration.

In one embodiment, a single separate structure is divided by two intersecting sub-trenches of the first trench 104. The two intersecting sub-trenches may be perpendicular to each other or intersect at an angle other than 90°, when viewed in a plane parallel to a surface of the substrate. In one embodiment, a single separate structure is divided by four intersecting sub-trenches of the first trench 104. The four intersecting sub-trenches may be uniformly distributed, i.e. an angle between two adjacent sub-trenches may be 45°. It is appreciated that each separate stack may be divided by another quantity of sub-trenches of the first trench 104. The quantity of the sub-trenches of the first trench 104 is related to a quantity of the to-be-formed devices, which is not enumerated herein.

The multiple sub-trenches of the first trench 104 may intersect with each other at a central position of the separate stack, such that the channel layers remaining after etching are uniformly distributed. Alternatively, the multiple sub-trenches of the first trench 104 may intersect with each other at another position. A width of a sub-trench of the first trench 104 may be determined according to a practical situation.

In one embodiment, the stacked layers may be etched first to obtain the first trench 104, and the isolation structure 105 (which may be an insulation layer) is formed in the first trench 104. Then, the stacked layers are etched to obtain the second trench 110. The second trench 110 does not overlap with the first trench 104. The second trench 110 may be formed between the first trenches 104 within adjacent separate structures.

Figure 6:
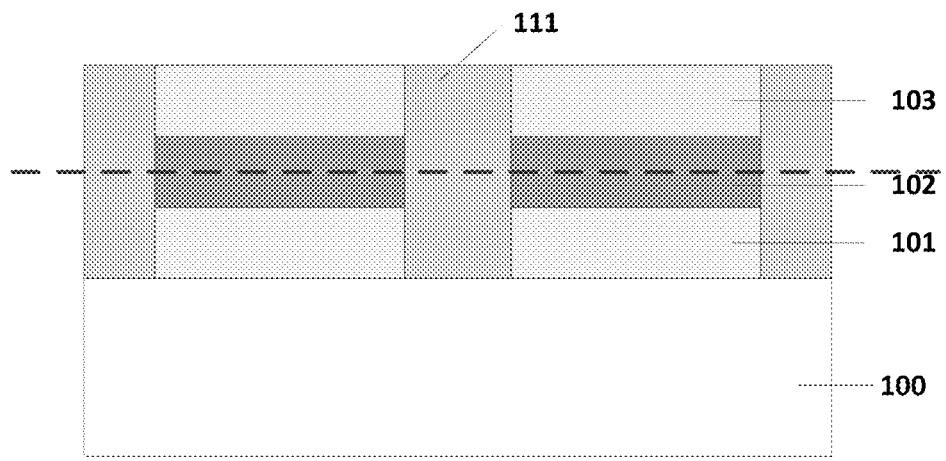
Figure 7:
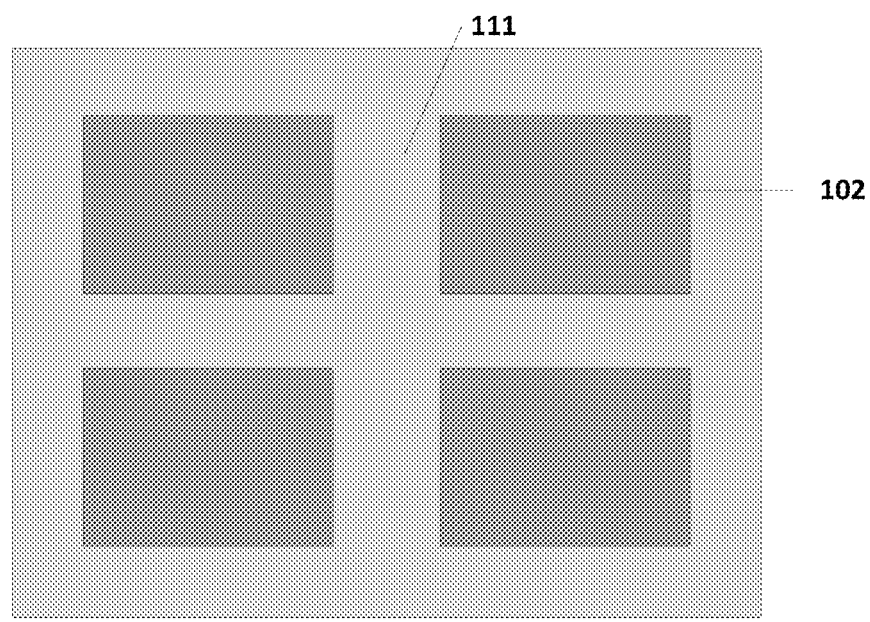
Figure 8:
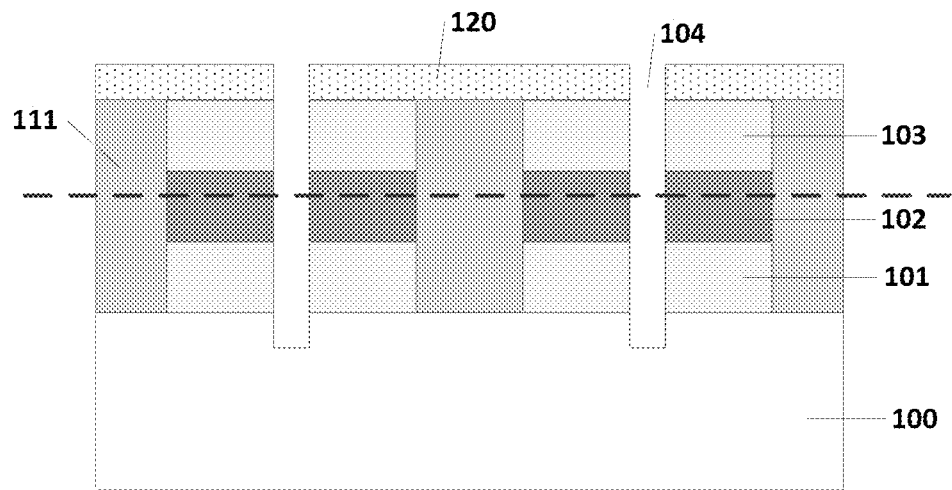
Figure 10:
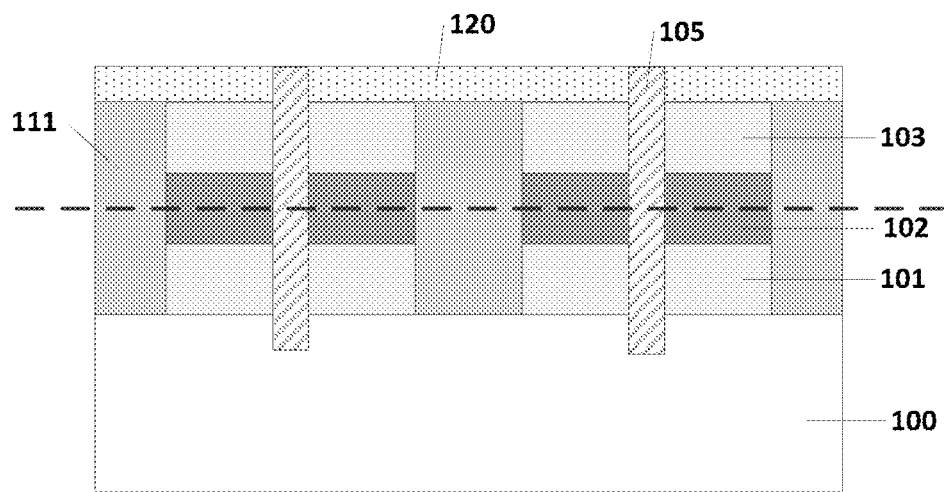
Figure 11:
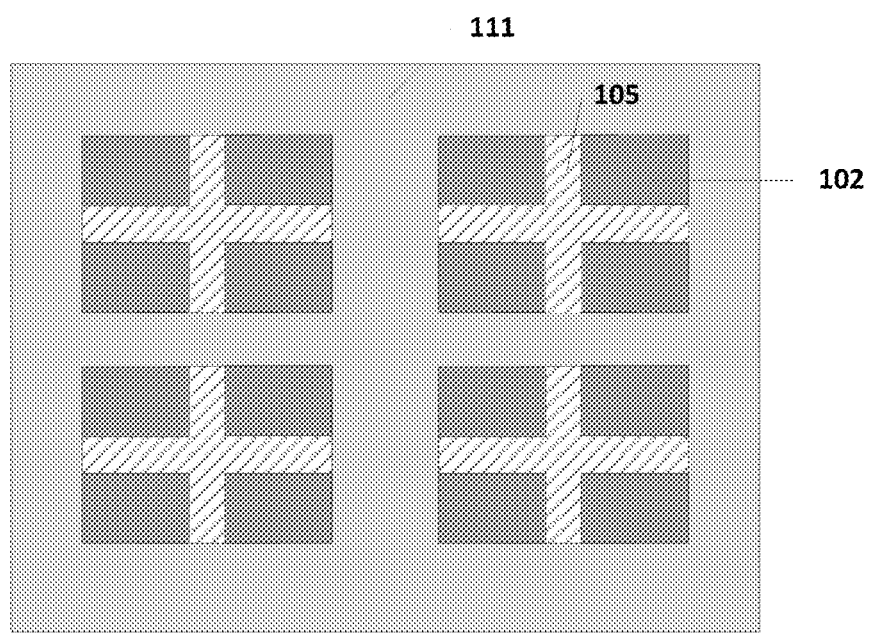

In another embodiment, the stacked layers may be etched first to obtain the second trench 110, so as to separate the stacks in which the to-be-formed devices are located. The second trench 110 is filled with an isolation structure 111. The isolation structure 111 may be an insulation layer, which is made of silicon oxide, silicon nitride, or the like. Reference is made to FIG. 6 and FIG. 7. FIG. 6 is a schematic diagram of a structure in a process of manufacturing a semiconductor device according to an embodiment of the present disclosure. FIG. 7 is a schematic diagram of a cross-section along a horizontal plane indicated by a dashed line in FIG. 6. Then, the separated stacked layers may be etched to obtain the first trench 104, by using a patterned mask layer 120. As an example, two sub-trenches of the first trench 104 are obtained, as shown in FIG. 8 and FIG. 9. The mask layer 120 may be a photoresist layer or a hard mask layer. The hard mask layer may be made of silicon oxide, silicon nitride, or the like. Afterwards, the mask layer 120 may be removed. In case of the hard mask layer, the mask layer 120 may not be removed and serve as a protection layer over the stacked layers. Then, the first trench 104 is filled with an isolation structure 105, and the filled isolation structure 105 may be level with the stacked layers. In a case that the mask layer 120 is not removed from the stacked layers, the isolation structure 105 may be level with the hard mask layer, as shown in FIG. 10 and FIG. 11. FIG. 10 is a schematic diagram of a structure in a process of manufacturing a semiconductor device according to an embodiment of the present disclosure. FIG. 11 is a schematic diagram of a cross-section along a horizontal plane indicated by a dashed line in FIG. 10. Afterwards, the isolation structure 111 in the second trench 110 may be removed, as shown in FIG. 12 and FIG. 13. FIG. 12 is a schematic diagram of a structure in a process of manufacturing a semiconductor device according to an embodiment of the present disclosure. FIG. 13 is a schematic diagram of a cross-section along a horizontal plane indicated by a dashed line in FIG. 12.

The isolation structure 105 is configured to improve structural stability of the devices and separate different devices, so as to improve a level of integration. The isolation structure 105 may be made of silicon oxide, silicon nitride, and the like. In one embodiment, the isolation structure 105 may include a strain material layer. The strain material layer is configured to provide compressive stress or tensile stress for the channel layer 102 that is in contact, so as to improve carrier mobility of the channel layer 102. The isolation structure 105 may include the strain material layer only. That is, the first trench 104 is filled with the strain material layer.

Alternatively, the isolation structure 105 may include the strain material layer and another insulation layer. In such case, the strain material layer is located outside another insulation layer, and is in contact with the channel layer 102. For example, the strain material layer may be located outside silicon oxide. In one embodiment, the strain material layer may be formed on sidewalls of the first trench 104, and then the first trench 104 is filled with silicon oxide.

In a case that the strain material layer provides compressive stress for the channel layer 102, hole mobility of the channel layer 102 may be improved. Therefore, the strain material layer capable of providing compressive stress for the channel layer 102 may be selected for a PMOS device. Specifically, the strain material layer having a lattice constant larger than that of material of the channel layer may be selected. For example, the strain material layer may be made of monocrystalline Si in a case that the channel layer 102 is made of SiGe.

In a case that the strain material layer provides tensile stress for the channel layer 102, electron mobility of the channel layer 102 may be improved. Therefore, the strain material layer capable of providing tensile tress for the channel layer 102 may be selected for an NMOS device. Specifically, the strain material layer having a lattice constant smaller than that of material of the channel layer may be selected. For example, the strain material layer may be made of SiGe in a case that the channel layer 102 is made of Si, and the strain material layer may be made of monocrystalline Ge in a case that the channel layer 102 is made of GeSn.

The stacked layers may be etched through lithography. In one embodiment, a photoresist may be formed on the stacked layers, and the photoresist is patterned through lithography and development. The stacked layers may be etched by using the patterned photoresist as a mask, to obtain the first trench 104 or the second trench 110. Then, the photoresist layer may be removed.

The stacked layers may be etched through, or further the substrate 100 may be over-etched, to obtain the first trench 104. The stacked layers may be etched partially or etched through, or further the substrate 100 may be over-etched, to obtain the second trench 110. In a case that a buffer layer is formed between the first doping layer 101 and the substrate 100, the first trench 104 may run through the stacked layers and stop at a surface of the buffer layer. Alternatively, the first trench 104 may run through a part of or the whole buffer layer.

Both the first trench 104 and the second trench 110 may be configured to separate different devices, and may be same in width and depth. A difference lies in that the first trench 104 is configured to separate the channel layers, sources, and drains of different devices, while the second trench 110 is configured to separate gate layers, sources, and drains of different devices. The first trench 104 and the second trench 110 may be filled with a same material or different materials.

Figure 14:
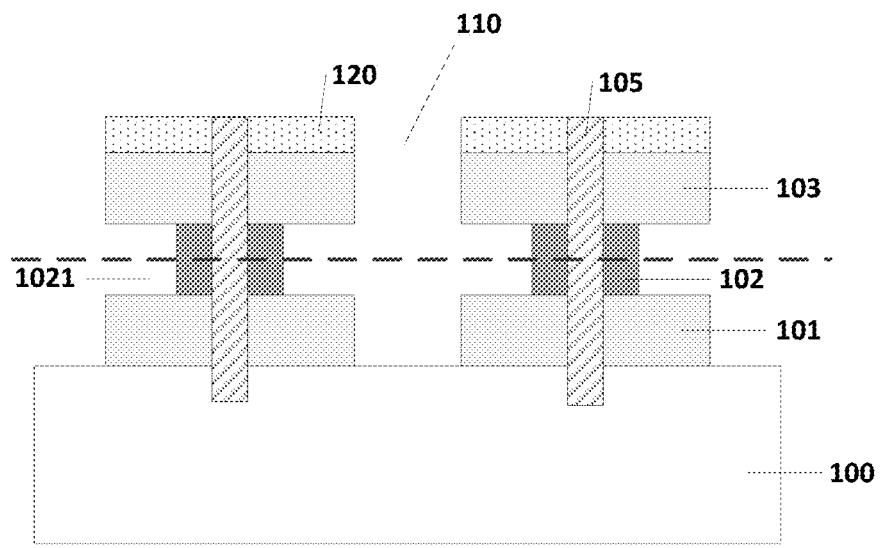
Figure 15:
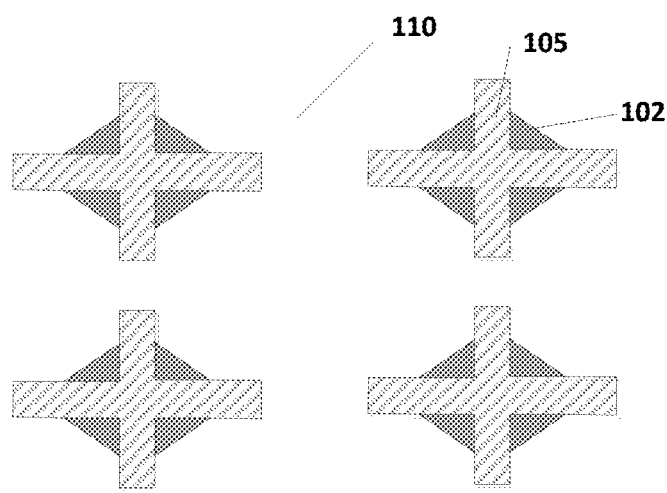

In step S203, the channel layer 102 is laterally etched, via the second trench 110. After the etching, the channel layer 102 at a sidewall of the isolation structure 105 remains, and a cavity 1021 between the first doping layer 101 and the second doping layer 103 is formed. Reference is made to FIG. 14 and FIG. 15.

Since the second trench 110 runs through the stacked layers, a sidewall of the first doping layer 101, the channel layer 102 and the second doping layer 103 are exposed from the stacked layers. In such case, the channel layer 102 may be laterally etched via the second trench 110, so as to remove a part of the channel layer 102 and form the cavity 1021 between the first doping layer 101 and the second doping layer 103. A part of the channel layer 102 remains at the sidewall of the isolation structure 105. The remaining channel layer 102 connects the first doping layer 101 and the second doping layer 103, and a length of a channel between the first doping layer 101 and the second doping layer 103 is equal to a thickness of the channel layer 102. Reference is made to FIG. 14 and FIG. 15. FIG. 14 is a schematic diagram of a structure in a process of manufacturing a semiconductor device according to an embodiment of the present disclosure. FIG. 15 is a schematic diagram of a cross-section along a horizontal plane indicated by a dashed line in FIG. 14. Since the channel layer 102 is etched via the second trench 110, the remaining channel layer 102 is away from the second trench 110. As shown in FIG. 13, the sub-trenches of the first trench 104 intersect with each other at a central position of each separate structure, and the remaining channel layer 102 in each separate structure is close to the central position. In the single separate structure, the isolation structure 105 in the first trench 104 separates multiple channel layers 102.

The channel layer 102 may be laterally etched via the second trench 110, through wet etching. For example, a part of the channel layer 102 may be removed through acid etching, reactive ion etching, or multiple oxidation-removal processes. In the oxidation-removal process, the channel layer 102 may be oxidized, such that an oxide layer is formed at a surface of the channel layer 102 exposed in the second trench 110. Then, the oxide layer at the surface of the channel layer 102 is removed.

In one embodiment, the channel layer 102 is oxidized by using plasma or a chemical self-limitation property. In such process, the channel layer 102 is oxidized faster than the first doping layer 101 and the second doping layer 103. An oxidizing agent may be oxygen ($O_2$) or ozone ($O_3$). After the oxidized layer is formed on the channel layer 102, the oxide may be precisely removed through gas etching. In one embodiment, the oxide layer is removed through dry etching.

In the oxidation-removal process, the channel layer 102 is oxidized within a certain thickness, and then the formed oxide is removed from the channel layer 102 through etching. Fast and precise etching can be achieved by repeating the above process. Generally, precision of the etching can reach a quasi-atomic level. A thickness of the oxidized layer in each oxidation may be controlled between 1A and 10A, by controlling process parameters in the oxidation. The quasi-atomic level can be reached by repeating the oxidization and etching with a high selection ratio.

As an example, the first doping layer 101, the channel layer 102, and the second doping layer 103 are made of Si, SiGe, and Si, respectively. SiGe may be oxidized first, and then an oxide of SiGe may be removed through etching. After repeating the oxidation and the etching, the SiGe layer can be laterally removed. As another example, the first doping layer 101, the channel layer 102, and the second doping layer 103 are made of SiGe, Si, and SiGe, respectively. Si may be oxidized first, and then $SiO_2$ may be removed through etching. After repeating the oxidation and the etching, the Si layer can be laterally removed.

Strain in the channel layer 102 may be changed when the channel layer 102 is laterally etched through the oxidation-removal process. Thereby, carrier mobility of the channel layer 102 is further improved. As an example, tensile stress on a Si layer increases with the Si layer being etched, thereby improving electron mobility of an NMOS transistor. As another example, compressive stress on a SiGe layer increases with the SiGe layer being etched, thereby improving hole mobility of a PMOS transistor.

In step S204, a gate dielectric layer 106 and a gate layer 107 are formed in the cavity 1021. Reference is made to FIG. 16 to FIG. 19.

Figure 16:
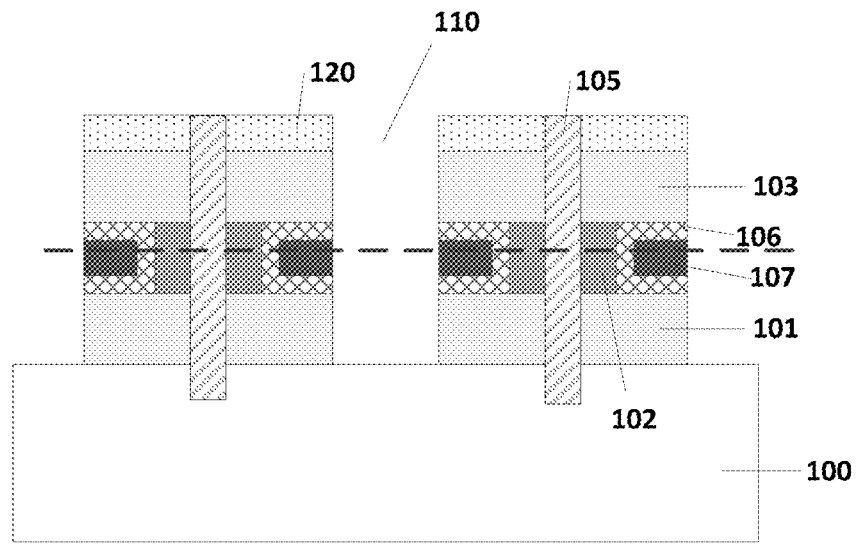
Figure 17:
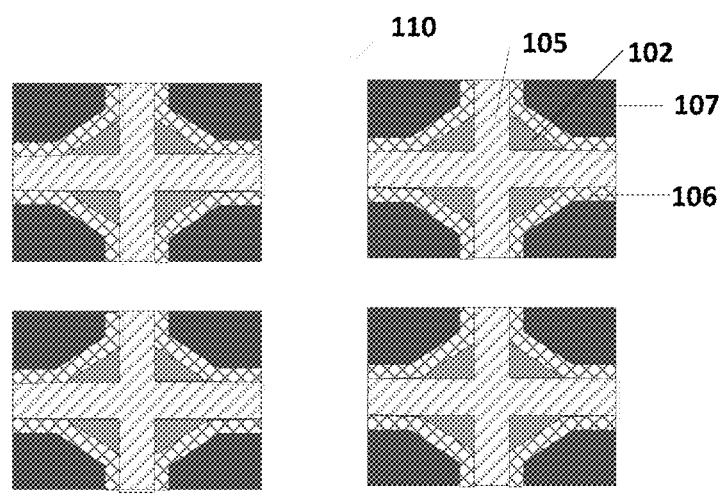

After the channel layer 102 is etched laterally, the cavity 1021 may be formed between the first doping layer 101 and the second doping layer 103. The cavity 1021 is close to the isolation structure 105 at a side which contacts a surface of the channel layer 102. Afterwards, the gate dielectric layer 106 and the gate layer 107 may be formed in the cavity 1021, as shown in FIG. 16 and FIG. 17. FIG. 16 is a schematic diagram of a structure in a process of manufacturing a semiconductor device according to an embodiment of the present disclosure. FIG. 17 is a schematic diagram of a cross-section along a horizontal plane indicated by a dashed line in FIG. 16.

In one embodiment, the gate dielectric layer 106 may be made of a high-K material, such as $HfO_2$, HfSiO, HfSiON, HfTaO, HfTiO, $La_2O_3$, or HrZrO. The gate dielectric layer 106 may be formed through ALD, CVD, or the like. The formed gate dielectric layer 106 covers a sidewall of the cavity 1021 and a surface of the channel layer 102 inside the cavity 1021. Further, the formed gate dielectric layer 106 may cover a sidewall of the stacked layers, an upper surface of the stacked layers, and a bottom of the second trench 110, which are outside the cavity 1021.

The gate layer 107 may be made of metal, another conductive material, or a combination thereof. For example, the gate layer 107 may be made of Ti, $TiAl_x$, TiN, $TaN_x$, HfN, $TiC_x$, $TaC_x$, W, Co, or a stack of layers thereof. The gate layer 107 may be formed through ALD, CVD, or the like. The formed gate layer 107 covers the gate dielectric layer 106.

Then, the gate layer 107 and the gate dielectric layer 106 that are located outside the cavity 1021 may be removed, to obtain the gate dielectric layer 106 and the gate layer 107 in the cavity 1021. In one embodiment, the gate dielectric layer 106 and the gate layer 107 on the upper surface of the stacked layers and at the bottom of the second trench 110 may be removed through anisotropic etching. Then, the gate dielectric layer 106 and the gate layer 107 at the sidewall of the stacked layers may be removed through isotropic etching.

Figure 18:
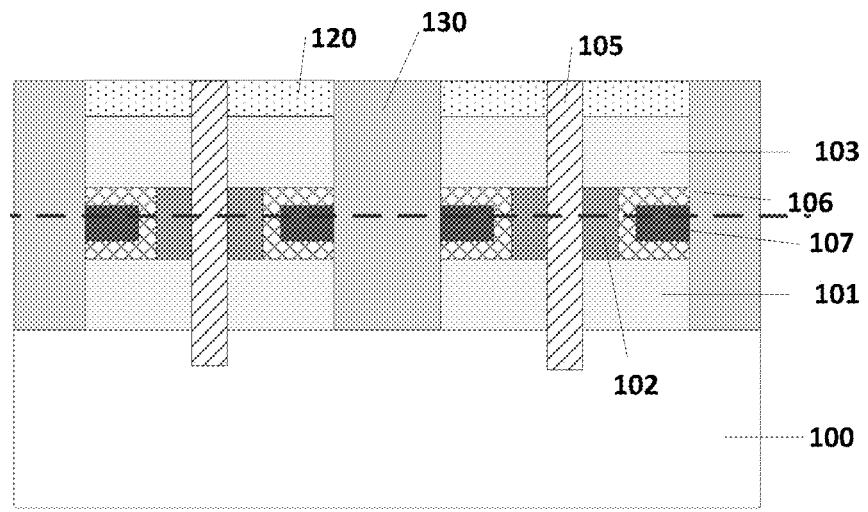
Figure 19:
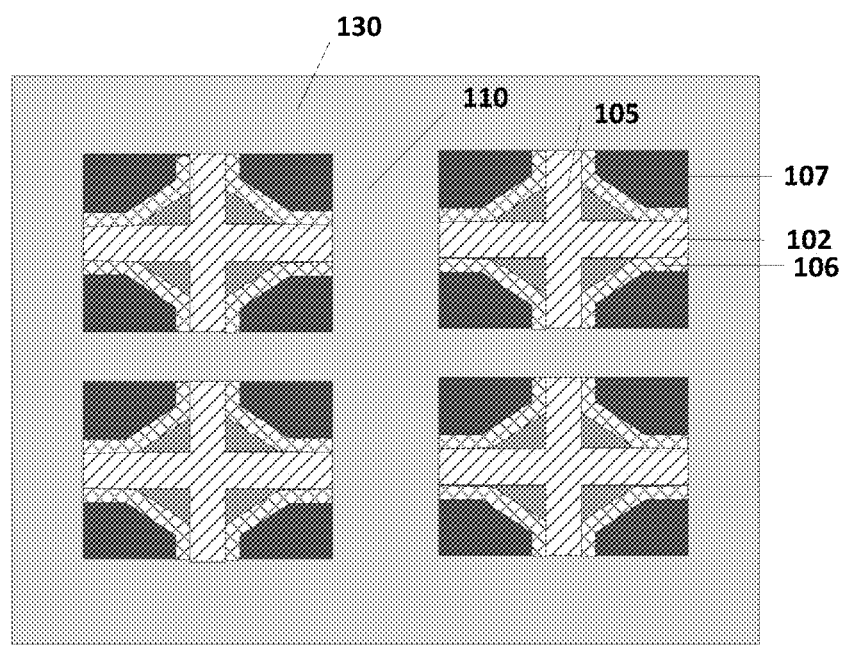

Afterwards, the stacked layers and the second trench 110 may be covered by a dielectric material layer 130, as shown in FIG. 18 and FIG. 19. FIG. 18 is a schematic diagram of a structure in a process of manufacturing a semiconductor device according to an embodiment of the present disclosure. FIG. 19 is a schematic diagram of a cross-section along a horizontal plane indicated by a dashed line in FIG. 18. Then, a connection wire (not shown) may be led out.

The method for manufacturing the semiconductor device is provided according to embodiments of the present disclosure. The stacked layers including the first doping material layer, the channel material layer, and the second doping material layer are formed on the substrate. One of the first doping material layer and the second doping layer material is configured to fabricate a source, and the other is configured to fabricate a drain. The stacked layers are etched to obtain the first trench and the second trench. The insulation layer is formed in the first trench. Then, the channel layer may be laterally etched via the second trench. After the etching, the channel layer on the sidewall of the insulation layer remains, and the cavity is formed between the first doping layer and the second doping layer. The gate dielectric layer and the gate layer are formed in the cavity. Hence, the source and the drain are horizontal film layers parallel to the surface of the substrate, and the channel layer remaining on the sidewall of the insulation layer serves as the vertical channel between the source and the drain. The channel length is related to a thickness of the film layer. Costly high-precision etching is not necessary, and therefore a device with a small size and a high performance can be achieved with a simple process and a low cost.

In another embodiment which is different from the forgoing embodiments, the multiple stacks on the substrate may be made of different materials. The stacks may be formed on the substrate through different processes. In this embodiment, the step S101 may include following steps S1013 and S1015.

In step S1013, a dielectric layer is formed on the substrate.

In step S1014, multiple through holes that run vertically through the dielectric layer are formed in the dielectric layer.

In step S1015, a stack is formed in each through hole.

The dielectric layer serves as the isolation structure among the multiple stacks. The multiple stacks include at least a first stack and a second stack. The first stack and the second stack are different in material.

Accordingly, the channel layers of different stacks may be etched through different processes. In one embodiment, for one or more stacks corresponding to each combination of materials, the S102 may include the following steps S1023 and S1024.

In step S1023, the dielectric layer is etched to form a third trench, where the third trench exposes the at least one sidewall of said stack.

In step S1024, the channel layer is laterally etched via the third trench.

Figure 3:
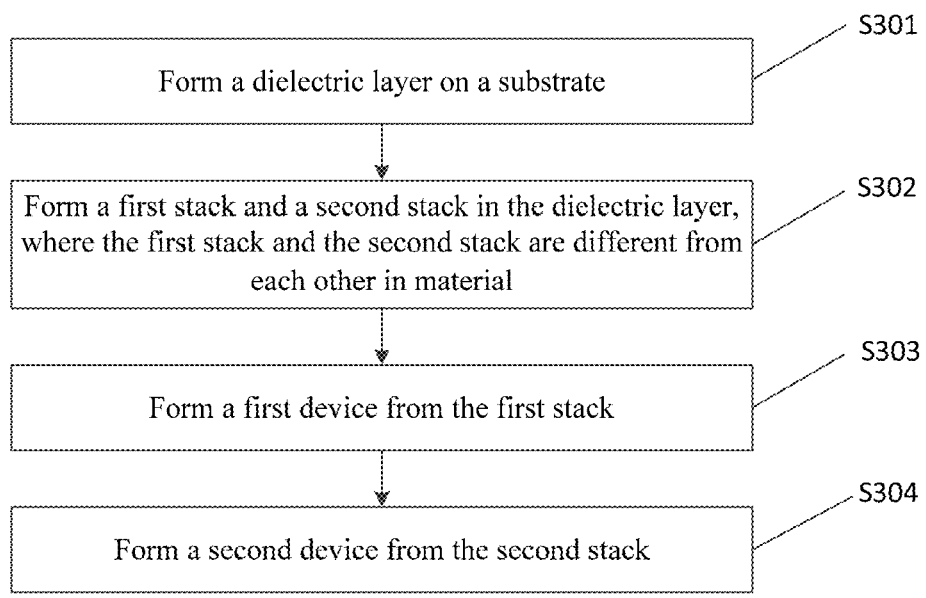
FIG. 3 is a flowchart of another method for manufacturing a semiconductor device according to an embodiment of the present disclosure.

On a basis of the aforementioned embodiments, reference is made to FIG. 3, which is a flowchart of another method for manufacturing a semiconductor device according to an embodiment of the present disclosure. The method may include following steps S301 to S304.

Figure 20:
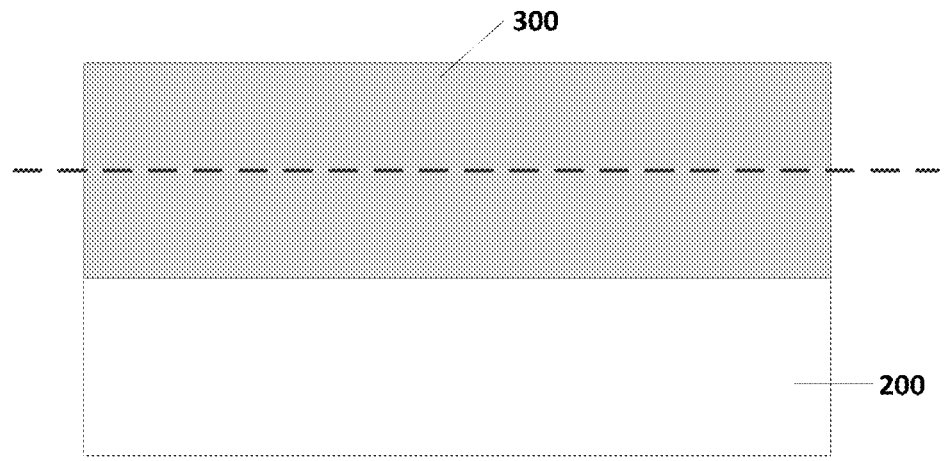
FIG. 20 to FIG. 45 are schematic diagrams of structures in a process of manufacturing a semiconductor device according to an embodiment of the present disclosure.
Figure 21:
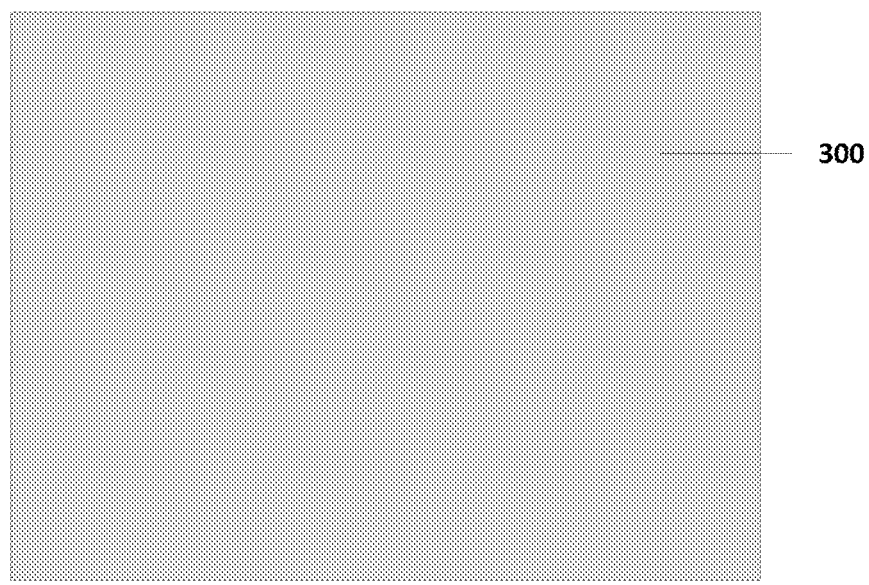

In step S301, a dielectric layer 300 is formed on a substrate 200. Reference is made to FIG. 20 and FIG. 21.

Similar to the substrate 100 in foregoing embodiments, the substrate 200 may be made of Si, Ge, SiGe, silicon on insulator (SOI), germanium on insulator (GOI), a III-V compound semiconductor, a II-IV compound semiconductor, or the like. In another embodiment, the substrate 200 may include another elementary semiconductor, another compound semiconductor (such as GaAs, InP or SiC), a stacked structure (such as Si/SiGe), or another epitaxial structure (such as a germanium silicon on insulator (SGOI)). In this embodiment, the substrate 200 may be a bulk silicon substrate.

The dielectric layer 300 may be an insulation material formed on the substrate 200, and is configured to separate different to-be-formed devices and protect these devices in subsequent manufacturing processes. A thickness of the dielectric layer 300 is related to a thickness of the to-be-formed device. The thicker the device is, the thicker the dielectric layer 300 is. Reference is made to FIG. 20 and FIG. 21. FIG. 20 is a schematic diagram of a structure in a process of manufacturing a semiconductor device according to an embodiment of the present disclosure. FIG. 21 is a schematic diagram of a cross-section along a horizontal plane indicated by a dashed line in FIG. 20.

The dielectric layer 300 may be made of silicon oxide, silicon nitride, or the like. The dielectric layer 300 may be formed on the substrate 200 through deposition. The deposition may include chemical vapor deposition (CVD), molecular beam epitaxy (MBE), atomic layer deposition (ALD), or the like.

In step S302, a first stack and a second stack are formed in the dielectric layer 300. The first stack and the second stack are different for each other in material. Reference is made to FIG. 22 to FIG. 29.

After the dielectric layer 300 is formed, the first stack and the second stack may be formed in the dielectric layer 300. The first stack and the second stack are made of different material, and thereby generally, the first stack and the second stack are not simultaneously formed.

Figure 22:
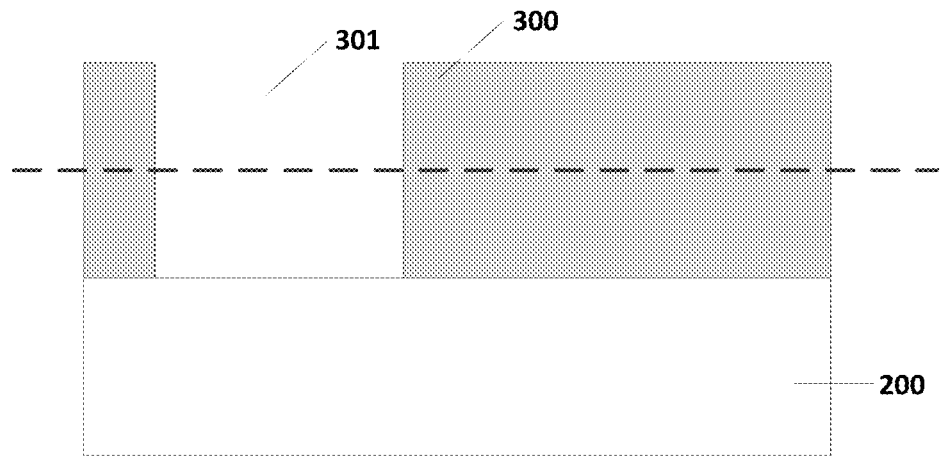
Figure 23:
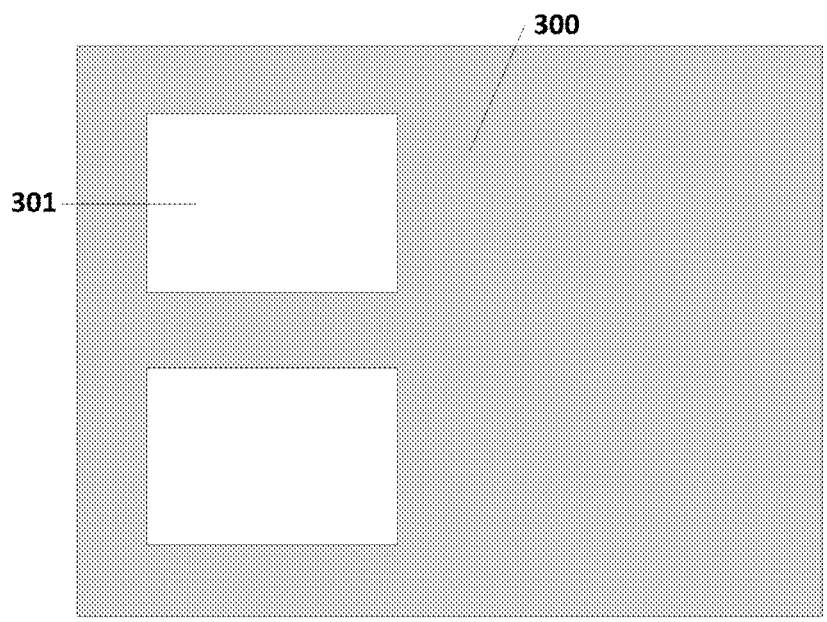
Figure 24:
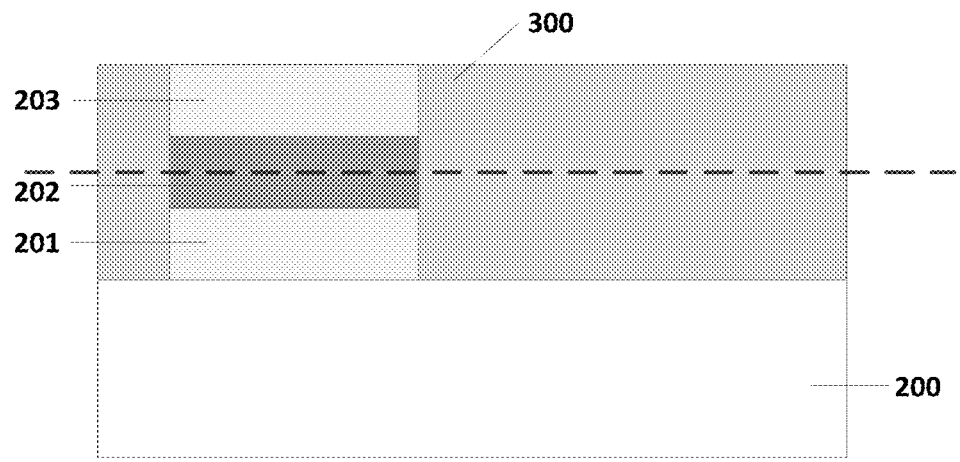
Figure 25:
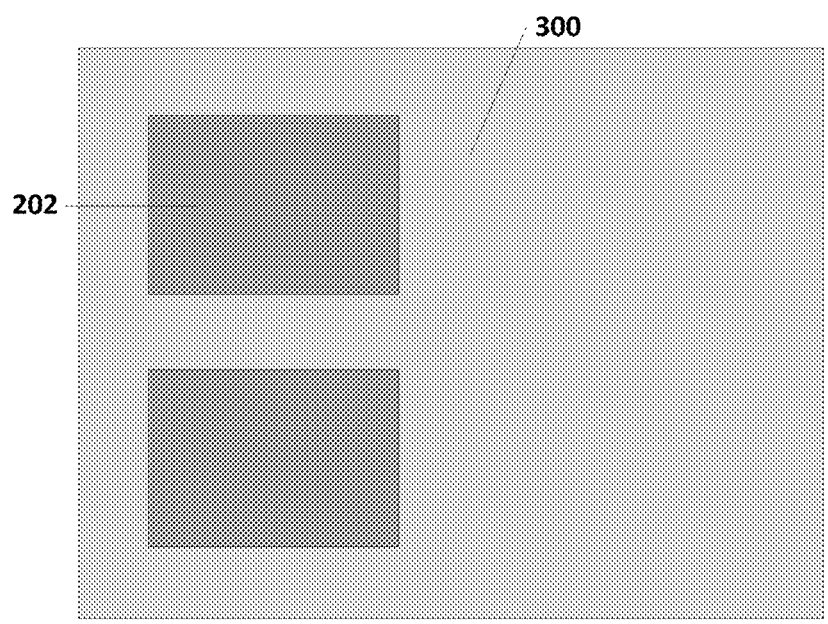
Figure 26:
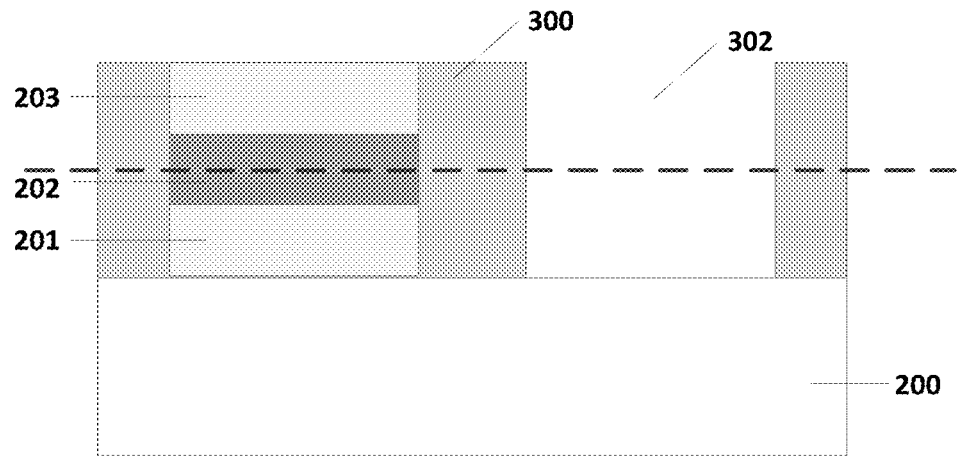
Figure 27:
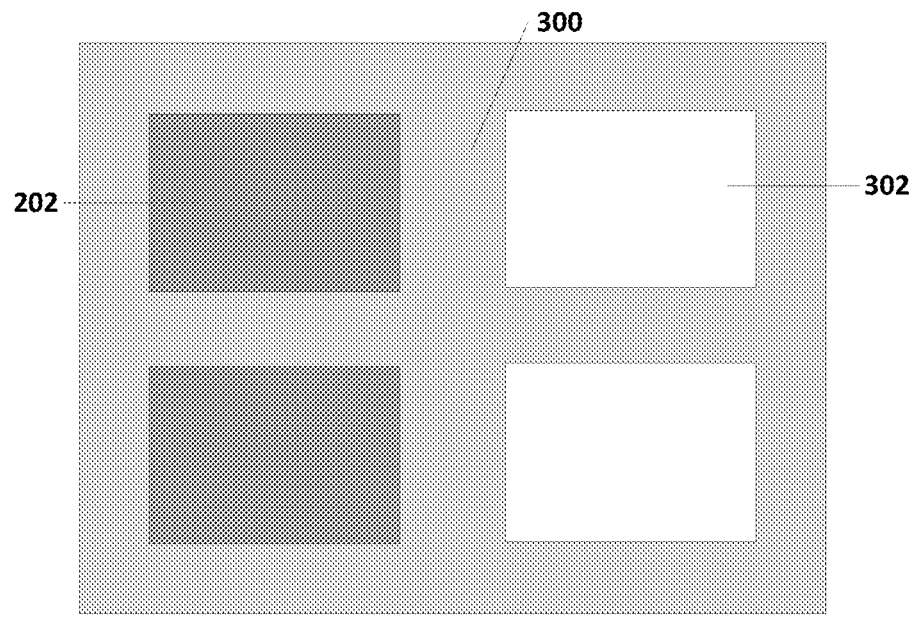
Figure 28:
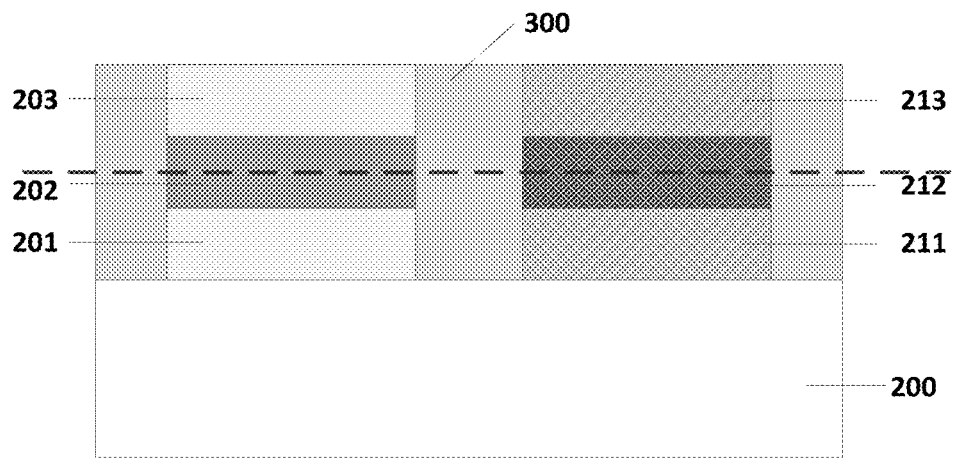
Figure 29:
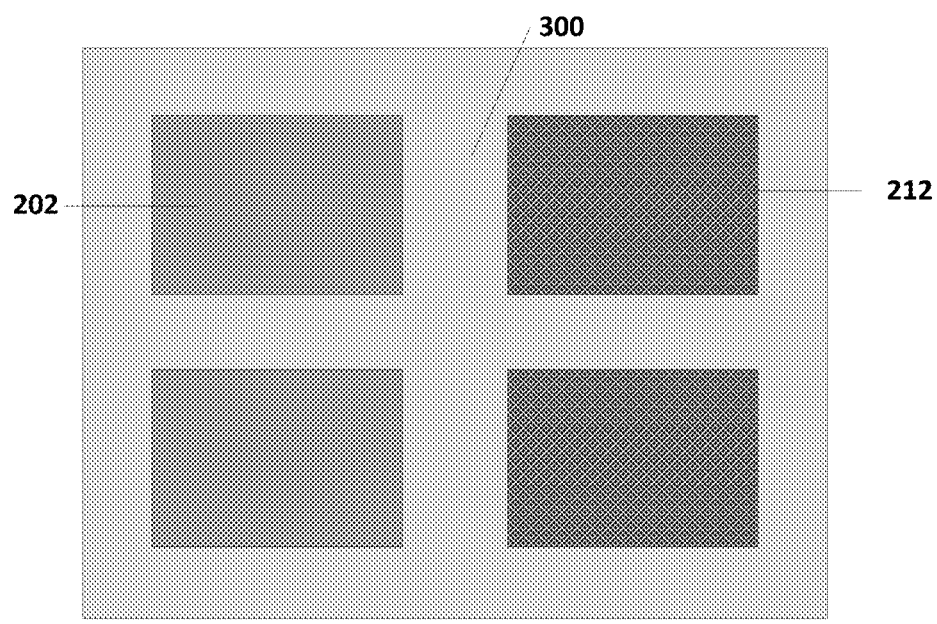

In one embodiment, the dielectric layer may be etched, to form a first through hole 301 running vertically through the dielectric layer 300, as shown in FIG. 22 and FIG. 23. FIG. 22 is a schematic diagram of a structure in a process of manufacturing a semiconductor device according to an embodiment of the present disclosure. FIG. 23 is a schematic diagram of a cross-section along a horizontal plane indicated by a dashed line in FIG. 22. Then, the first stack may be formed in the first through hole, as shown in FIG. 24 and FIG. 25. FIG. 24 is a schematic diagram of a structure in a process of manufacturing a semiconductor device according to an embodiment of the present disclosure. FIG. 25 is a schematic diagram of a cross-section along a horizontal plane indicated by a dashed line in FIG. 24. Afterwards, the dielectric layer 300 is etched to form a second through hole 302 running vertically through the dielectric layer 300, as shown in FIG. 26 and FIG. 27. FIG. 26 is a schematic diagram of a structure in a process of manufacturing a semiconductor device according to an embodiment of the present disclosure. FIG. 27 is a schematic diagram of a cross-section along a horizontal plane indicated by a dashed line in FIG. 26. Then, the second stack is formed in the second through hole 302, as shown in FIG. 28 and FIG. 29. FIG. 28 is a schematic diagram of a structure in a process of manufacturing a semiconductor device according to an embodiment of the present disclosure. FIG. 29 is a schematic diagram of a cross-section along a horizontal plane indicated by a dashed line in FIG. 28. The first through hole 301 and the second through hole 302 are not connected and do not overlap with each other, such that the first stack and the second stack are independent from each other. The dielectric layer 300 between the first stack and the second stack serves as the isolation structure that isolates the first stack and the second stack from each other.

The first through hole 301 and the second through hole 302 may be formed by etching the dielectric layer 300 through lithography. In one embodiment, a photoresist may be formed on the dielectric layer 300, and the photoresist is patterned through lithography and development. The dielectric layer 300 may be etched by using the patterned photoresist as a mask, to obtain the first through hole 301 or the second through hole 302. Then, the photoresist layer may be removed. In another embodiment, a hard mask layer and a photoresist layer may be formed on the dielectric layer 300, and the photoresist is patterned through lithography and development. The hard mask may be etched by using the patterned photoresist as a mask, to obtain a patterned hard mask layer. Then, the dielectric layer 300 may be etched by using the patterned hard mask layer as a mask, to obtain the first through hole 301 or the second through hole 302. Afterwards, the photoresist layer and the hard mask layer may be removed.

The first through hole 301 and the second through hole 302 obtained through etching run vertically through the dielectric layer 300. In one embodiment, the dielectric layer 300 may be etched through to the substrate 200, or further the substrate 200 may be over-etched, to obtain the first through hole 301 and the second through hole 302. A size of the first through hole 301 within a plane parallel to a surface of the substrate 200 is related to an area occupied by a first device that is to be formed from the first stack. A size of the second through hole 302 within a plane parallel to a surface of the substrate 200 is related to an area occupied by a second device that is to be formed from the second stack. The sizes of the first through hole 301 and the second through hole 302 may be set according to a practical situation.

There may be multiple first through holes 301. The first stack may be formed in each first through hole 301, and the first stacks have a same structure and are made of same materials. Therefore, these first stacks may be synchronously formed. As shown in FIG. 23, a quantity of the first through holes 301 may be two. Similarly, there may be multiple second through holes 302. The second stack may be formed in each second through hole 302, and the second stacks have a same structure and are made of a same material. Therefore, the second stacks may be synchronously formed. As shown in FIG. 27, a quantity of the second through holes 302 may be two.

In one embodiment, the first stack serves as a foundation of the first device, and may include a first doping layer 201, a channel layer 202 and a second doping layer 203. Herein the channel layer of the first stack is denoted as a first channel layer 202, in order to distinguish from that of the second stack. The first doping layer 201 and the second doping layer 203 may serve as a source and a drain. That is, one of the first doping layer 201 and the second doping layer 203 serves as a source, and the other serves as a drain. Reference is made to FIG. 24. Materials of the first doping layer 201, the first channel layer 202 and the second doping layer 203 may be determined according to a practical situation.

In one embodiment, the substrate 200 is a silicon substrate, and the first doping layer 201, the first channel layer 202, and the second doping layer 203 may be made of SiGe, Si, and SiGe, respectively. Namely, SiGe serves as the source and the drain, and Si serves as a channel. In such case, the first doping layer 201 and the silicon substrate have similar lattice constants, thereby facilitating forming the first doping layer 201 with good quality.

In one embodiment, the substrate 200 is a silicon substrate, and the first doping layer 201, the first channel layer 202, and the second doping layer 203 may be made of Si, SiGe, and Si, respectively. Namely, Si serves as the source and the drain, and SiGe serves as a channel. In such case, the first doping layer 201 and the silicon substrate are made of the same material, thereby facilitating forming the first doping layer 201 with good quality. Electron mobility of Si is approximately 1600 $cm^2V^{-1} s^{-1}$ and hole mobility of Si is approximately 430 $cm^2V^{-1} s^{-1}$. Electron mobility of Ge is approximately 3900 $cm^2V^{-1} s^{-1}$ and hole mobility of Ge is approximately 1900 $cm^2V^{-1} s^{-1}$. Hence, carrier mobility of SiGe is higher than that of Si, and therefore a device made of SiGe may have a good performance.

In one embodiment, the substrate 200 is a silicon substrate, and the first doping layer 201, the first channel layer 202, and the second doping layer 203 may be made of Ge, GeSn, and Ge, respectively. Namely, Ge serves as the source and the drain, and GeSn serves as a channel. In such case, the first doping layer 201 differs a bit from the silicon substrate in lattice, and therefore a buffer layer may be formed between the first doping layer 201 and the silicon substrate. The buffer layer may be a Ge layer formed in low temperature, or a stack of a Ge layer formed in low temperature and a Ge layer formed in high temperature. The buffer layer is configured to match the first doping layer 201 with the silicon substrate in lattice constants, such that the first doping layer 201 is formed with good quality. Carrier mobility of Ge is higher than that of Si, carrier mobility of Sn is also high, and therefore a device made of Ge and GeSn may have a good performance.

It is appreciated that the first doping layer 201, the first channel layer 202, and the second doping layer 203 may be made of other materials such as GaAs, InAs, InAb, or a III-V compound. These materials have higher carrier mobility, which is beneficial for a high performance of the device. Those skilled in the art may select proper materials for the first doping layer 201, the first channel layer 202, and the second doping layer 203 according to a practical situation.

Thickness, doping concentration, and epitaxy of the first doping layer 201, the first channel layer 102 and the second doping layer 103 may refer to the description relevant to those of the first doping material layer 101a, the channel material layer 102a, and the second doping material layer 103a in the foregoing embodiments, which is not repeated herein.

After the first stack is formed, the first stack may be planarized to be level with the dielectric layer 300, so as to facilitate subsequent processes. Reference is made to FIG. 24.

In one embodiment, there may be multiple first stacks on the substrate 200. Each first stack may include the first doping layer 201, the first channel layer 202, and the second doping layer 203 that are stacked along a vertical direction. The multiple first stacks may be separated from each other by an insulation material. An integration level of the device is improved in this embodiment.

Similar to the first stack, the second stack serves a foundation of the second device, and may include a first doping layer, a channel layer and a second doping layer of the second stack. The second stack may be different from the first stack in material. Herein the first doping layer, the channel layer and the second doping layer of the second stack are denoted as a third doping layer 211, a second channel layer 212 and a fourth doping layer 213, so as to distinguish from those of the first stack. The third doping layer 211 and the fourth doping layer 213 may serve as a source and a drain. That is, one of the third doping layer 211 and the fourth doping layer 213 serves as a source, and the other serves as a drain. Materials of the third doping layer 211, the second channel layer 212 and the fourth doping layer 213 may be determined according to a practical situation.

Materials of the first stack and the second stack may be partially different. For example, the first doping layer 201 and the third doping layer 211 are made of different materials, and/or the first channel layer 202 and the second channel layer 212 are made of different materials, and/or the second doping layer 203 and the fourth doping layer 213 are made of different materials. In one embodiment, the first doping layer 201, the first channel layer 202 and the second doping layer 203 are made of Si, SiGe, and Si, respectively; and the third doping layer 211, the second channel layer 212 and the fourth doping layer 213 are made of SiGe, Si, and SiGe, respectively.

Hence, the first stack and the second stack may not be simultaneously formed. In one embodiment, firstly the first through hole 301 is etched and the first stack is formed, and then the second through hole 302 is etched and the second stack is formed. A concept of some embodiments of the present disclosure is manufacturing devices in dielectric layer 300 in batch, where devices of a same batch have a same structure and are made of a same material. Accordingly, devices of various types can be formed on the substrate 200.

In one embodiment, the substrate 200 is a silicon substrate, and the third doping layer 211, the second channel layer 212, and the fourth doping layer 213 may be made of SiGe, Si, and SiGe, respectively. Namely, SiGe serves as the source and the drain, and Si serves as a channel. In another embodiment, the substrate 200 is a silicon substrate, and the third doping layer 211, the second channel layer 212, and the fourth doping layer 213 may be made of Si, SiGe, and Si, respectively. Namely, Si serves as the source and the drain, and SiGe serves as a channel. In another embodiment, the substrate 200 is a silicon substrate, and the third doping layer 211, the second channel layer 212, and the fourth doping layer 213 may be made of Ge, GeSn, and Ge, respectively. Namely, Ge serves as the source and the drain, and GeSn serves as a channel. In such case, the third doping layer 211 differs a bit from the silicon substrate in lattice, and therefore a buffer layer may be formed between the third doping layer 211 and the silicon substrate. The buffer layer may be a Ge layer formed in low temperature, or a stack of a Ge layer formed in low temperature and a Ge layer formed in high temperature. The buffer layer is configured to match the third doping layer 211 with the silicon substrate in lattice constants, such that the third doping layer 211 is formed with good quality. It is appreciated that in another embodiment, the third doping layer 211, the second channel layer 212 and the fourth doping layer 213 may be made of other materials.

Similar to the first doping layer 201, the first channel layer 102, and the second doping layer 103, thickness, doping concentration, and epitaxy of the third doping layer 211, the second channel layer 212 and the fourth doping layer 213 may refer to the description relevant to those of the first doping material layer 101a, the channel material layer 102a, and the second doping material layer 103a in the foregoing embodiments, which is not repeated herein. It is noted that the first stack and the second stack are different from each other in material.

In one embodiment, there may be multiple second stacks on the substrate 200. Each second stack may include the third doping layer 211, the second channel layer 212 and the fourth doping layer 213 that are stacked along a vertical direction. The multiple second stacks may be separated from each other by an insulation material. An integration level of the device is improved in this embodiment.

In step S303, the first device is formed from the first stack. Reference is made to FIG. 30 to FIG. 37.

In one embodiment, the dielectric layer 300 between the first stack and the second stack may serve as the isolation structure between the first stack and the second stack. The first device may include the first doping layer 201, the first channel layer 202, and the second doping layer 203 that are on a sidewall of the isolation structure, and include a first gate dielectric layer 206 and a first gate layer 207 in a first cavity 2021. The first channel layer 202 is concave with respect to the first doping layer 201 and the second doping layer 203, at at least one sidewall of the first stack. Thereby, the first cavity 2021 is formed between the first doping layer 201 and the second doping layer 203. A first sidewall of the first stack is in contact with the isolation structure, and the at least one side wall does not include the first sidewall.

In one embodiment, the dielectric layer 300 may be etched first, to obtain a third trench 303 exposing the at least one sidewall of the first stack, in a process of forming the first device. At this time, sidewalls of the second stack are covered by the remaining dielectric layer 300.

Figure 30:
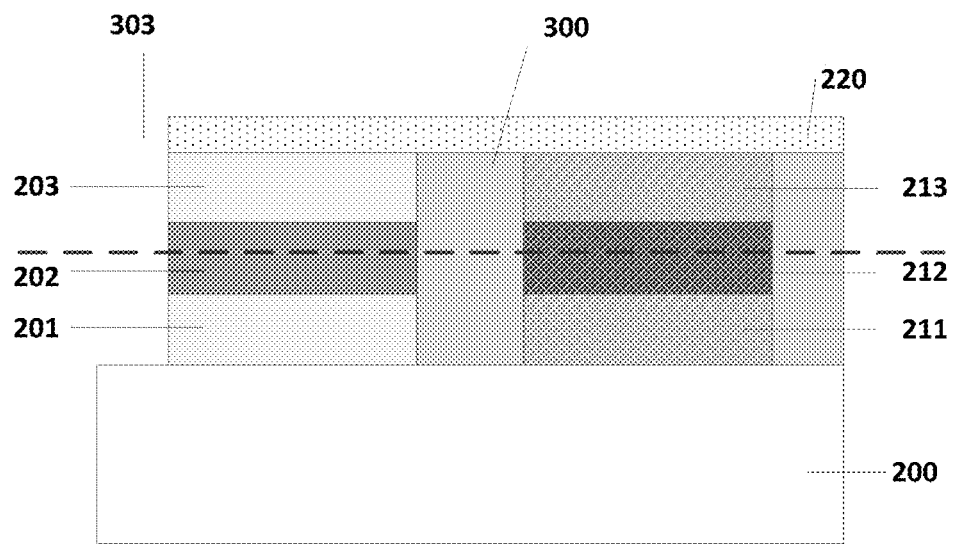
Figure 31:
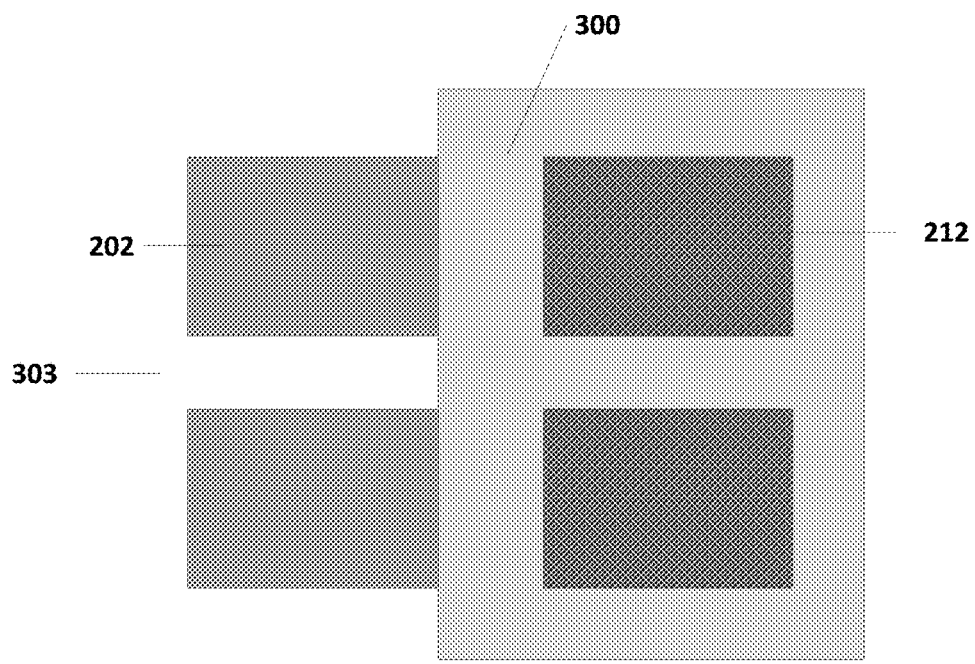

In one embodiment, the third trench 303 may expose multiple sidewalls of the first stack, as shown in FIG. 30 and FIG. 31. FIG. 30 is a schematic diagram of a structure in a process of manufacturing a semiconductor device according to an embodiment of the present disclosure. FIG. 31 is a schematic diagram of a cross-section along a horizontal plane indicated by a dashed line in FIG. 30. The third trench 303 exposes three sidewalls of the first stack. The isolation structure between the first stack and second stack covers the first sidewalls of both the first stack and the second stack, where the first sidewall of a stack refers to a sidewall in contact with the isolation structure. In another embodiment, the third trench 303 may expose only one sidewall of the first stack. For example, the third trench 303 only exposes a sidewall opposite to the first sidewall, or a sidewall adjacent to the first sidewall.

In one embodiment, the dielectric layer 300 may be etched by using a patterned mask layer 220. The mask layer 220 may be a photoresist layer or a hard mask layer. The hard mask layer may be made of silicon oxide, silicon nitride, or the like. Afterwards, the mask layer 220 may be removed. In case of the hard mask layer, the mask layer 220 may not be removed and serve as a protection layer over the stacked layers.

Figure 32:
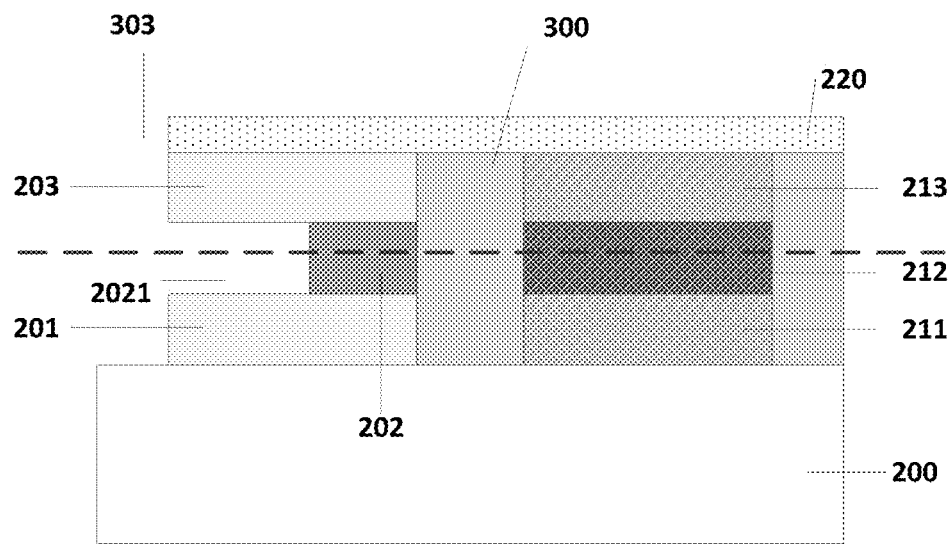
Figure 33:
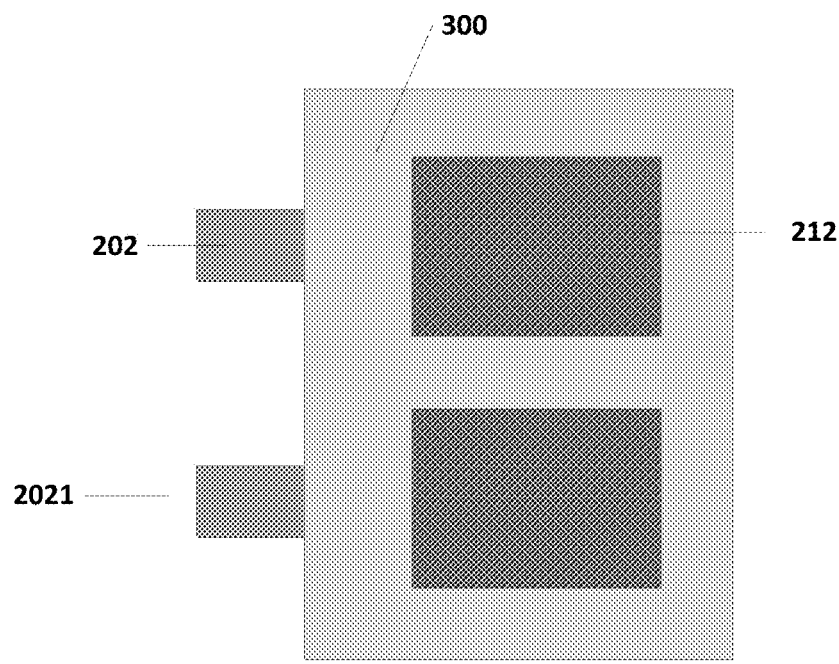

Then, the first channel layer 202 may be etched laterally via the third trench 303, to remove a portion of the first channel layer 202 and form the first cavity 2021 between the first doping layer 201 and the second doping layer 203. A portion of the first channel layer 202 remains at a sidewall of the isolation structure after the etching. The remaining first channel layer 202 connects the first doping layer 201 and the second doping layer 203. A length of a channel between the source and the drain is equal to a thickness of the first channel layer 202. Reference is made to FIG. 32 and FIG. 33. FIG. 32 is a schematic diagram of a structure in a process of manufacturing a semiconductor device according to an embodiment of the present disclosure. FIG. 33 is a schematic diagram of a cross-section along a horizontal plane indicated by a dashed line in FIG. 32.

Since the first channel layer 202 is etched via the third trench 303, the remaining first channel layer 202 is away from the third trench 303. As shown in FIG. 33, the remaining first channel layer 202 is close to a center position of each stack along the sidewall of the isolation structure.

The first channel layer 202 may be laterally etched via the third trench 303, through wet etching. For example, a part of the first channel layer 202 may be removed through acid etching, reactive ion etching, or multiple oxidation-removal processes. In the oxidation-removal process, the first channel layer 202 may be oxidized, such that a first oxide layer is formed at a surface of the first channel layer 202 exposed in the third trench 303. Then, the first oxide layer at the surface of the first channel layer 202 is removed.

In one embodiment, the first channel layer 202 is oxidized by using plasma or a chemical self-limitation property. In such process, the first channel layer 202 is oxidized faster than the first doping layer 201 and the second doping layer 203. An oxidizing agent may be oxygen ($O_2$) or ozone ($O_3$). After the oxidized layer is formed on the first channel layer 202, the oxide may be precisely removed through gas etching. In one embodiment, the first oxide layer is removed through dry etching.

In the oxidation-removal process, the first channel layer 202 is oxidized within a certain thickness, and then the formed oxide is removed from the first channel layer 202 through etching. Fast and precise etching can be achieved by repeating the above process. Generally, precision of the etching can reach a quasi-atomic level. A thickness of the oxidized layer in each oxidation may be controlled between 1A and 10A, by controlling process parameters in the oxidation. The quasi-atomic level can be reached by repeating the oxidization and etching with a high selection ratio.

As an example, the first doping layer 201, the first channel layer 202, and the second doping layer 203 are made of Si, SiGe, and Si, respectively. SiGe may be oxidized first, and then an oxide of SiGe may be removed through etching. After repeating the oxidation and the etching, the SiGe layer can be laterally removed. As another example, the first doping layer 201, the first channel layer 202, and the second doping layer 203 are made of SiGe, Si, and SiGe, respectively. Si may be oxidized first, and then $SiO_2$ may be removed through etching. After repeating the oxidation and the etching, the Si layer can be laterally removed.

Strain in the first channel layer 202 may be changed when the first channel layer 202 is laterally etched through the oxidation-removal process. Thereby, carrier mobility of the first channel layer 202 is further improved. As an example, tensile stress on a Si layer increases with the Si layer being etched, thereby improving electron mobility of an NMOS transistor. As another example, compressive stress on a SiGe layer increases with the SiGe layer being etched, thereby improving hole mobility of a PMOS transistor.

Figure 34:
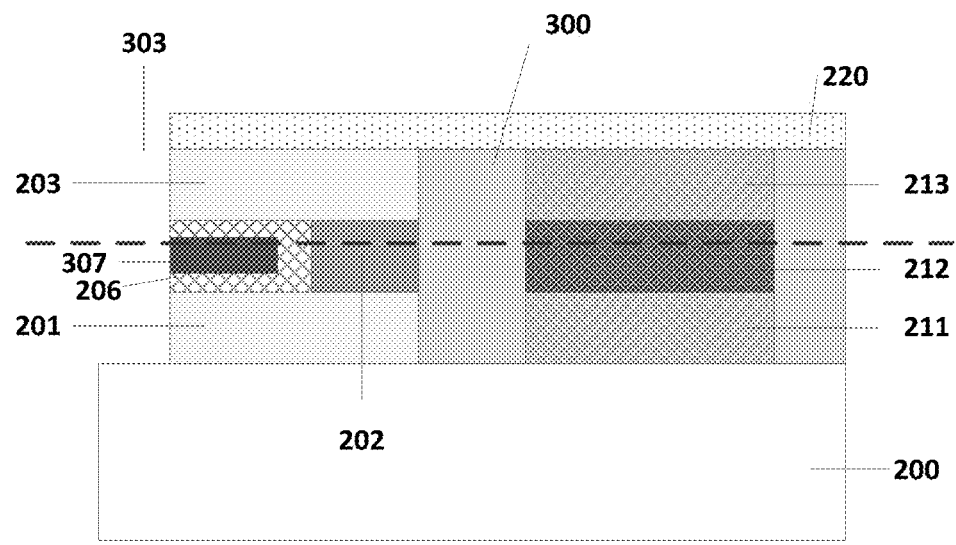
Figure 35:
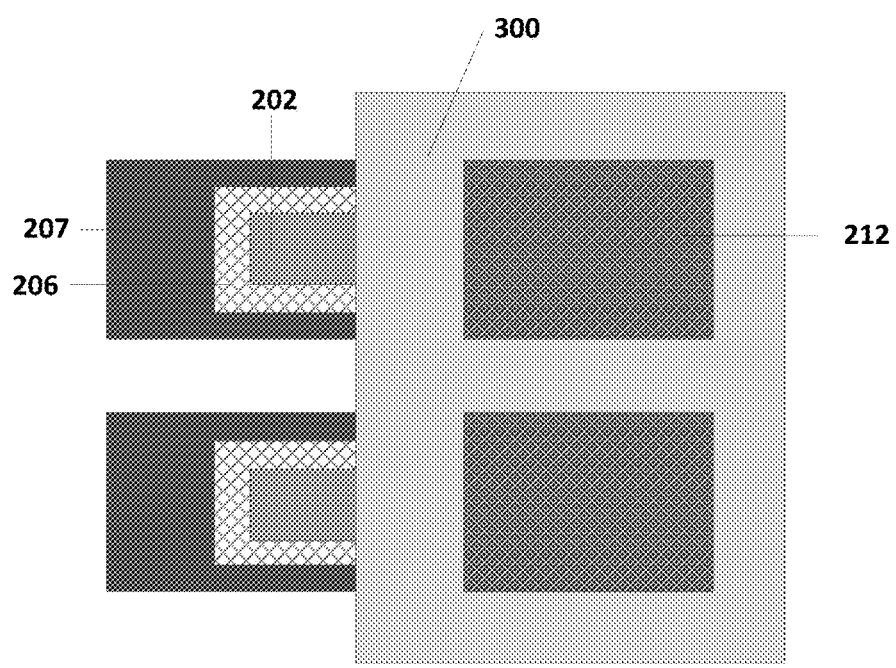

Then, the first gate dielectric layer 206 and the first gate layer 207 may be formed in the first cavity 2021, as shown in FIG. 34 and FIG. 35. FIG. 34 is a schematic diagram of a structure in a process of manufacturing a semiconductor device according to an embodiment of the present disclosure. FIG. 35 is a schematic diagram of a cross-section along a horizontal plane indicated by a dashed line in FIG. 34.

In one embodiment, the first gate dielectric layer 206 may be made of a high-K material, such as $HfO_2$, HfSiO, HfSiON, HfTaO, HfTiO, $La_2O_3$, or HrZrO. The first gate dielectric layer 206 may be formed through ALD, CVD, or the like. The formed first gate dielectric layer 206 covers a sidewall of the first cavity 2021 and a surface of the first channel layer 202 inside the first cavity 2021. Further, the formed first gate dielectric layer 206 may cover a sidewall of the first stack, an upper surface of the first stack, and a bottom of the third trench 303, which are outside the first cavity 2021.

The first gate layer 207 may be made of metal, another conductive material, or a combination thereof. For example, the first gate layer 207 may be made of Ti, $TiAl_x$, TiN, $TaN_x$, HfN, $TiC_x$, $TaC_x$, W, Co, or a stack of layers thereof. The first gate layer 207 may be formed through ALD, CVD, or the like. The formed first gate layer 207 covers the first gate dielectric layer 206.

Then, the first gate layer 207 and the first gate dielectric layer 206 that are located outside the first cavity 2021 may be removed, to obtain the first gate dielectric layer 206 and the first gate layer 207 in the first cavity 2021. In one embodiment, the first gate dielectric layer 206 and the first gate layer 207 on the upper surface of the first stack and at the bottom of the third trench 303 may be removed through anisotropic etching. Then, the first gate dielectric layer 206 and the first gate layer 207 at the sidewall of the first stack may be removed through isotropic etching.

Figure 36:
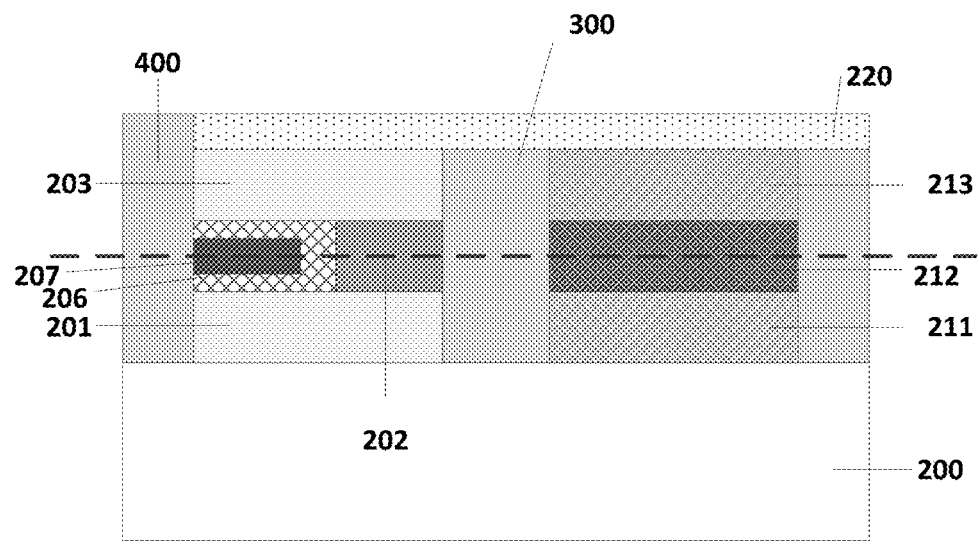
Figure 37:
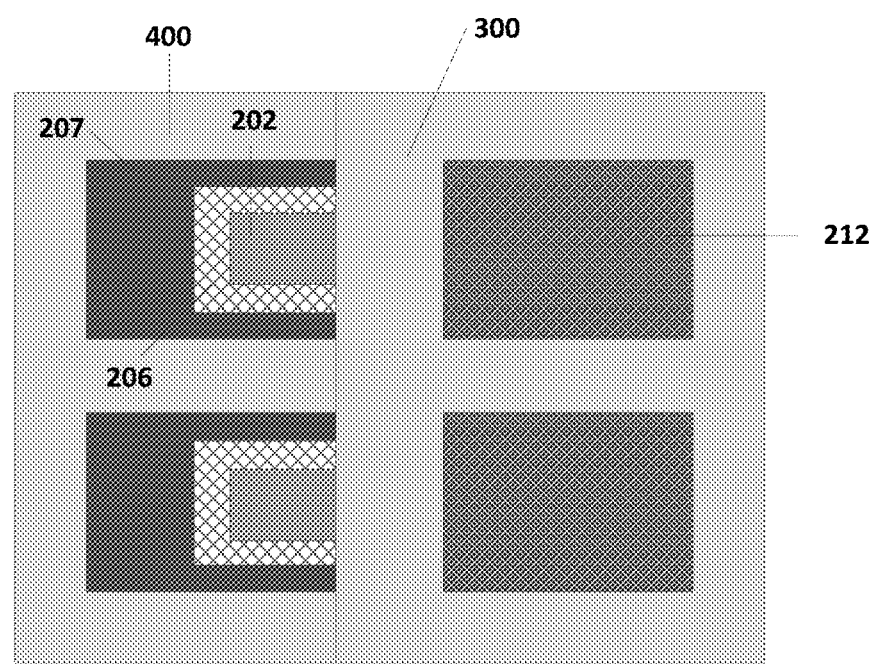

Afterwards, the third trench 303 may be filled with a dielectric material 400, as shown in FIG. 36 and FIG. 37. FIG. 36 is a schematic diagram of a structure in a process of manufacturing a semiconductor device according to an embodiment of the present disclosure. FIG. 37 is a schematic diagram of a cross-section along a horizontal plane indicated by a dashed line in FIG. 36. The filled dielectric material 400 may be level with the remaining mask layer 220 or the first stack.

In step S304, the second device is formed from the second stack, as shown in FIG. 38 to FIG. 45.

In one embodiment, the second device may include the third doping layer 211, the second channel layer 212 and the fourth doping layer 213 that are on a sidewall of the isolation structure, and include a second gate dielectric layer 216 and a second gate layer 217 in the second cavity 2121. The second channel layer 212 is concave with respect to the third doping layer 211 and the fourth doping layer 213, at at least one sidewall of the second stack. Thereby, the second cavity 2121 is formed between the third doping layer 211 and the fourth doping layer 213. A first sidewall of the second stack is in contact with the isolation structure, and the at least one side wall does not include the first sidewall.

A process of forming the second device is similar to that of the first device, and is briefly described herein. Details may refer to the process of forming the first device.

In the process of forming the second device, the dielectric layer 300 may be etched first, to obtain a third trench corresponding to the second device, which exposes the at least one sidewall of the second stack. The third trench formed in the process of forming the second device may be different from the third trench formed in the process of forming the first device in parameters. In order to distinguish from the third trench 303 obtained in the process of forming the first device, herein the third trench obtained in the process of forming the second device denoted as a fourth trench 304. At this time, the sidewalls of the first stack may be covered by the remaining dielectric layer 300 and the dielectric material 400 filling the third trench.

Figure 38:
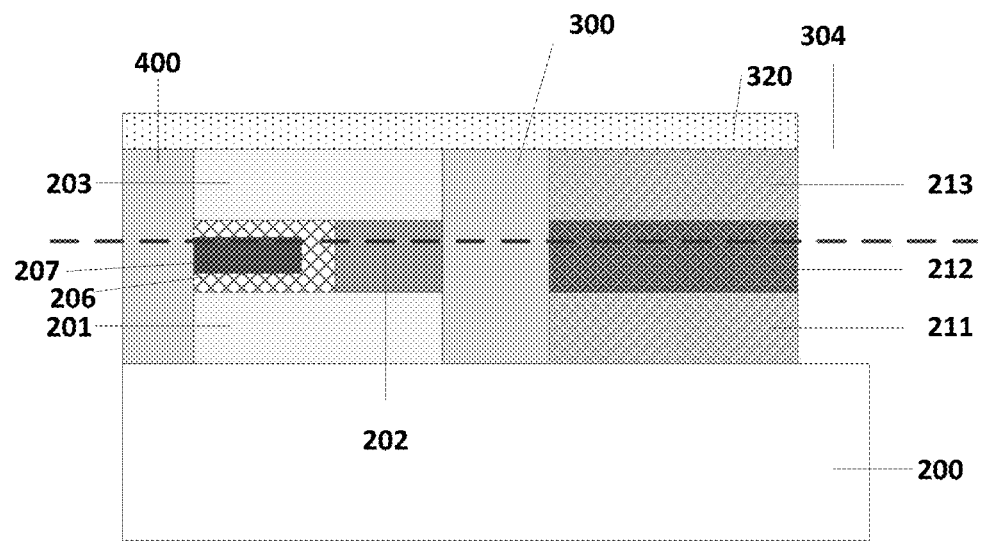
Figure 39:
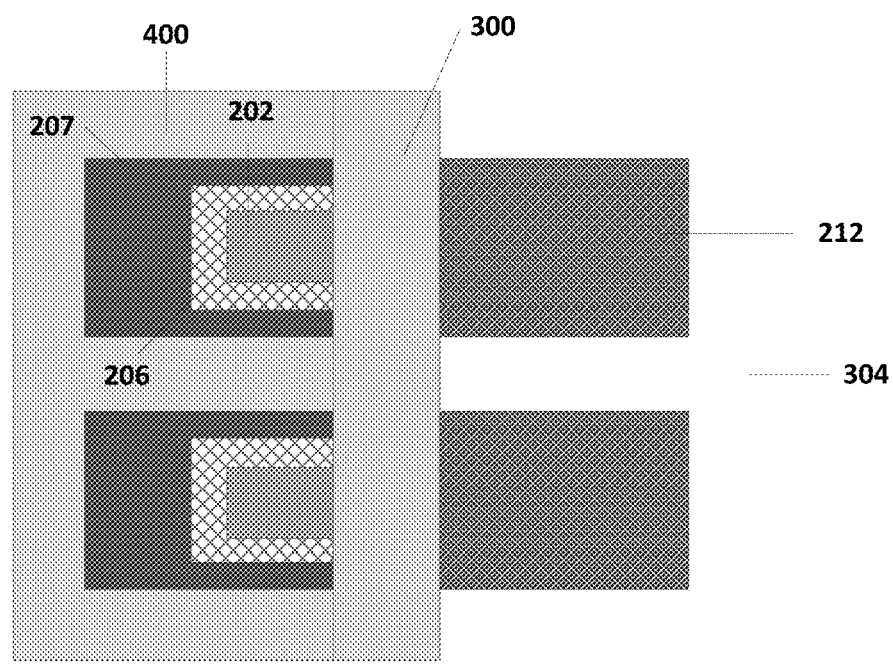

In one embodiment, the fourth trench 304 may expose multiple sidewalls of the second stack, as shown in FIG. 38 and FIG. 39. FIG. 38 is a schematic diagram of a structure in a process of manufacturing a semiconductor device according to an embodiment of the present disclosure. FIG. 39 is a schematic diagram of a cross-section along a horizontal plane indicated by a dashed line in FIG. 38. The fourth trench 304 exposes three sidewalls of the second stack. The isolation structure between the second stack and second stack covers the first sidewalls of both the first stack and the second stack, where the first sidewall of a stack refers to a sidewall in contact with the isolation structure. In another embodiment, the fourth trench 304 may expose only one sidewall of the second stack. For example, the fourth trench 304 only exposes a sidewall opposite to the first sidewall, or a sidewall adjacent to the first sidewall. In one embodiment, the dielectric layer 300 may be etched by using a patterned mask layer 320. Details of the mask layer 320 may refer to the mask layer 220.

Figure 40:
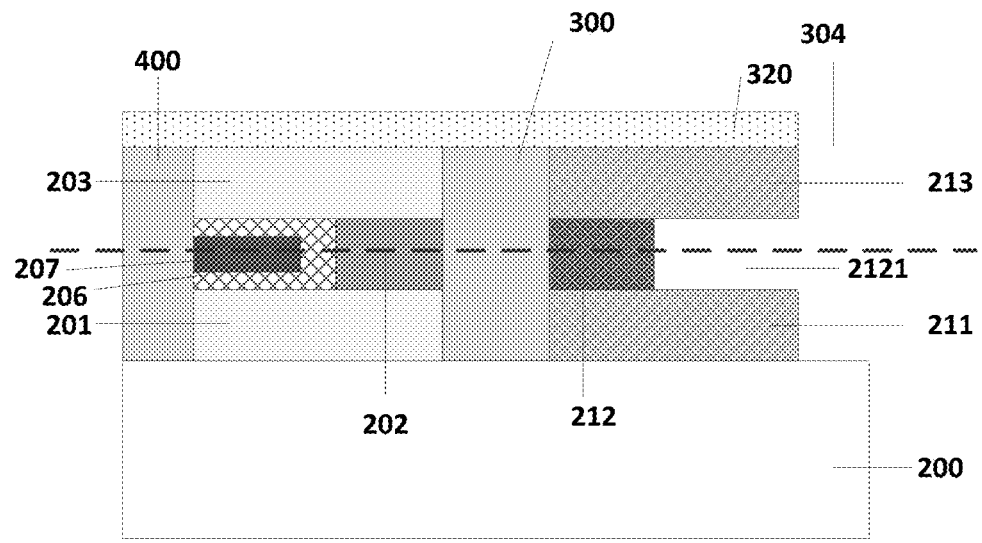
Figure 41:
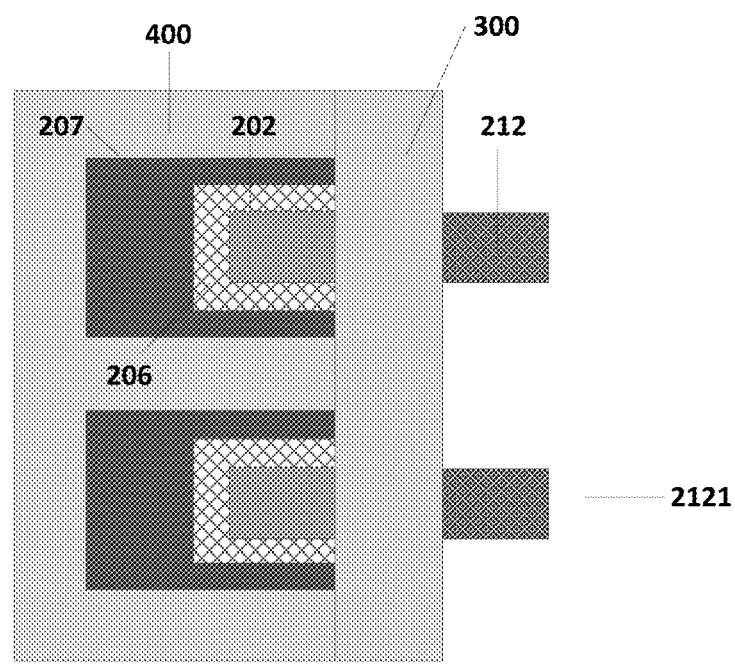

Then, the second channel layer 212 may be etched laterally via the fourth trench 304, to remove a portion of the second channel layer 212 and form the second cavity 2121 between the third doping layer 211 and the fourth doping layer 213. A portion of the second channel layer 212 remains at a sidewall of the isolation structure after the etching. The remaining second channel layer 212 connects the third doping layer 211 and the fourth doping layer 213. A length of a channel between the source and the drain is equal to a thickness of the second channel layer 212. Reference is made to FIG. 40 and FIG. 41. FIG. 40 is a schematic diagram of a structure in a process of manufacturing a semiconductor device according to an embodiment of the present disclosure. FIG. 41 is a schematic diagram of a cross-section along a horizontal plane indicated by a dashed line in FIG. 40.

Since the second channel layer 212 is etched via the fourth trench 304, the remaining second channel layer 212 is away from the fourth trench 304. As shown in FIG. 41, the remaining second channel layer 212 is close to a center position of each stack along the sidewall of the isolation structure.

The second channel layer 212 may be laterally etched via the fourth trench 304, through wet etching. For example, a part of the second channel layer 212 may be removed through acid etching, reactive ion etching, or multiple oxidation-removal processes. In the oxidation-removal process, the second channel layer 212 may be oxidized, such that a second oxide layer is formed at a surface of the second channel layer 212 exposed in the fourth trench 304. Then, the second oxide layer at the surface of the second channel layer 212 is removed.

Figure 42:
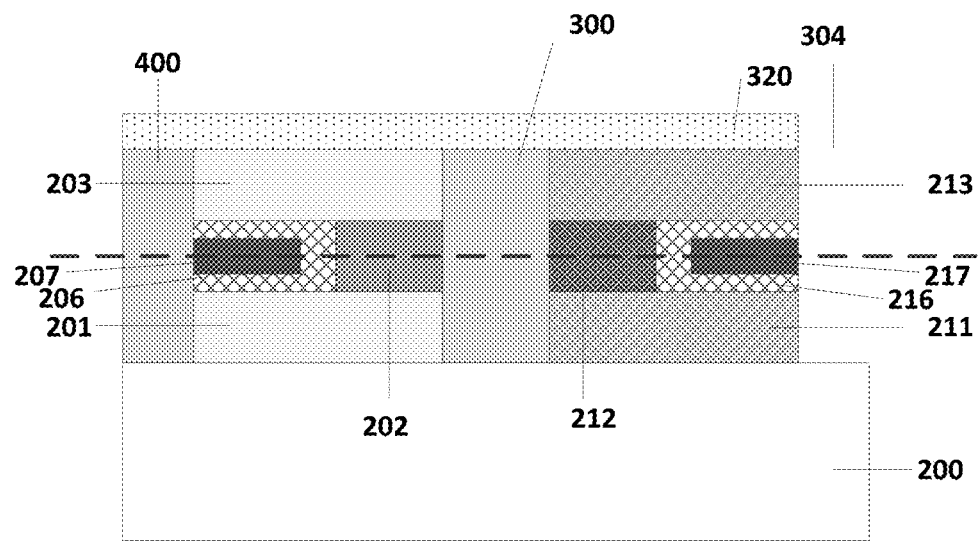
Figure 43:
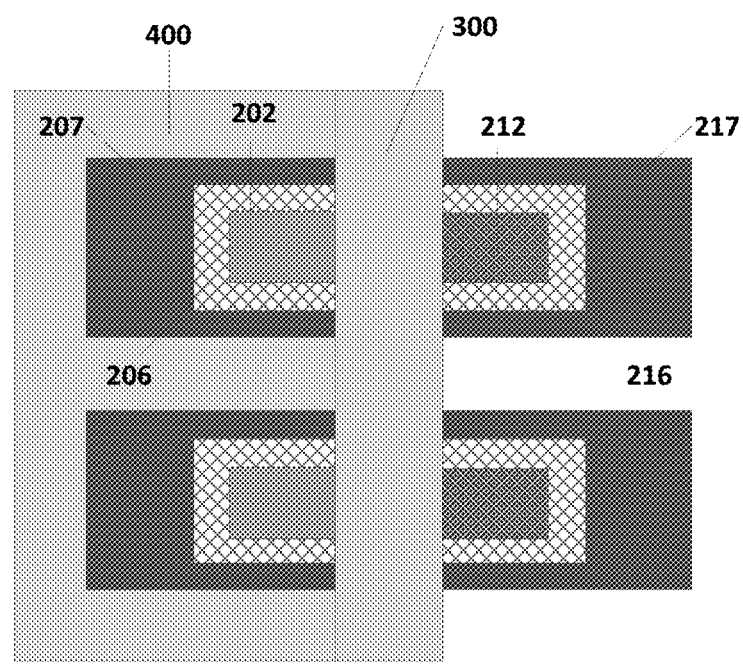

After the second channel layer 212 is laterally etched, the second gate dielectric layer 216 and the second gate layer 217 may be formed in the second cavity 2121, as shown in FIG. 42 and FIG. 43. FIG. 42 is a schematic diagram of a structure in a process of manufacturing a semiconductor device according to an embodiment of the present disclosure. FIG. 43 is a schematic diagram of a cross-section along a horizontal plane indicated by a dashed line in FIG. 42.

In one embodiment, the second gate dielectric layer 216 may be made of a high-K material, such as $HfO_2$, HfSiO, HfSiON, HfTaO, HfTiO, $La_2O_3$, or HrZrO. The second gate dielectric layer 216 may be formed through ALD, CVD, or the like. The formed second gate dielectric layer 216 covers a sidewall of the second cavity 2121 and a surface of the second channel layer 212 inside the second cavity 2121. Further, the formed second gate dielectric layer 216 may cover a sidewall of the second stack, an upper surface of the second stack, and a bottom of the fourth trench 304, which are outside the second cavity 2121.

The second gate layer 217 may be made of metal, another conductive material, or a combination thereof. For example, the second gate layer 217 may be made of Ti, $TiAl_x$, TiN, $TaN_x$, HfN, $TiC_x$, $TaC_x$, W, Co, or a stack of layers thereof. The second gate layer 217 may be formed through ALD, CVD, or the like. The formed second gate layer 217 covers the second gate dielectric layer 216.

After being deposited, the second gate layer 217 and the second gate dielectric layer 216 that are located outside the second cavity 2121 may be removed, to obtain the second gate dielectric layer 216 and the second gate layer 217 in the second cavity 2121. In one embodiment, the second gate dielectric layer 216 and the second gate layer 217 on the upper surface of the second stack and at the bottom of the fourth trench 304 may be removed through anisotropic etching. Then, the second gate dielectric layer 216 and the second gate layer 217 at the sidewall of the second stack may be removed through isotropic etching.

Figure 44:
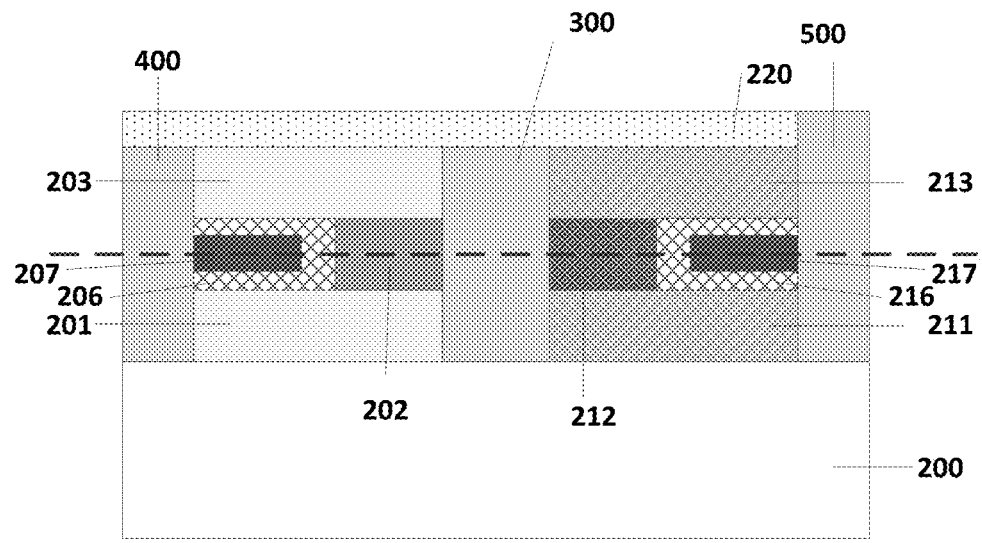
Figure 45:
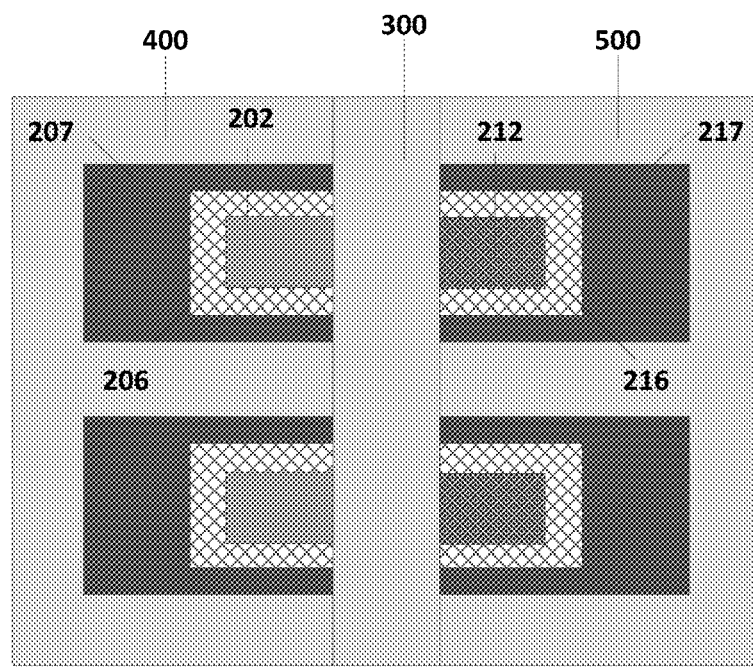

Afterwards, the fourth trench 304 may be filled with a dielectric material 500, as shown in FIG. 44 and FIG. 45. FIG. 44 is a schematic diagram of a structure in a process of manufacturing a semiconductor device according to an embodiment of the present disclosure. FIG. 45 is a schematic diagram of a cross-section along a horizontal plane indicated by a dashed line in FIG. 44. The filled dielectric material 500 may be level with the remaining mask layer 320 or the second stack. Then, a connection wire may be led out (not shown).

In the aforementioned embodiments, the isolation structure is the dielectric layer 300 between the first stack and the second stack. The isolation structure may separate the first channel layer 202 from the second channel layer 212, separate the first gate dielectric layer 206 from the second gate dielectric layer 216, and separate the first gate layer 207 from the second gate layer 217.

In some embodiments, the isolation structure may be an insulation layer. The insulation layer may include a first strain material layer and/or a second strain material layer. The first strain material layer may be formed on a sidewall of the first stack, and may be configured to provide compressive stress or tensile stress for the first channel layer 202 in contact with the first strain material layer, so as to improve carrier mobility of the first channel layer 202. The second strain material layer may be formed on a sidewall of the second stack, and may be configured to provide compressive stress or tensile stress for the second channel layer 212 in contact with the second strain material layer, so as to improve carrier mobility of the second channel layer 212.

In a case that the first strain material layer provides compressive stress for the first channel layer 202, hole mobility of the first channel layer 202 may be improved. Therefore, the first strain material layer capable of providing compressive stress for the first channel layer 202 may be selected for a PMOS device. Specifically, the strain first material layer having a lattice constant larger than that of material of the first channel layer may be selected. For example, the first strain material layer may be made of monocrystalline Si in a case that the first channel layer 202 is made of SiGe.

In a case that the first strain material layer provides tensile stress for the first channel layer 202, electron mobility of the first channel layer 202 may be improved. Therefore, the first strain material layer capable of providing tensile tress for the first channel layer 202 may be selected for an NMOS device. Specifically, the first strain material layer having a lattice constant smaller than that of material of the first channel layer may be selected. For example, the first strain material layer may be made of SiGe in a case that the first channel layer 202 is made of Si, and the first strain material layer may be made of monocrystalline Ge in a case that the first channel layer 202 is made of GeSn.

Similarly, hole mobility of the second channel layer 212 may be improved, and a lattice constant of the second strain material layer may be larger than that of material of the second channel layer 212, in a case that the second strain material layer provides compressive stress for the second channel layer 212. Electron mobility of the second channel layer 212 may be improved, and a lattice constant of the second strain material layer may be smaller than that of material of the second channel layer 212, in a case that the second strain material layer provides tensile stress for the second channel layer 212.

In one embodiment, materials of the first strain material layer and the second strain material layer are selected based on materials of the first channel layer 202 and the second channel layer 212. There may be a material which can provide tensile stress for the first channel layer 202 and provide compressive stress for the second channel layer 212. Hence, the first strain material layer and the second strain material layer may be made of a same material or different materials. The first strain material layer and the second strain material layer may be in direct contact with each other, or may be separated from each other by another material, which is not limited herein.

Figure 46:
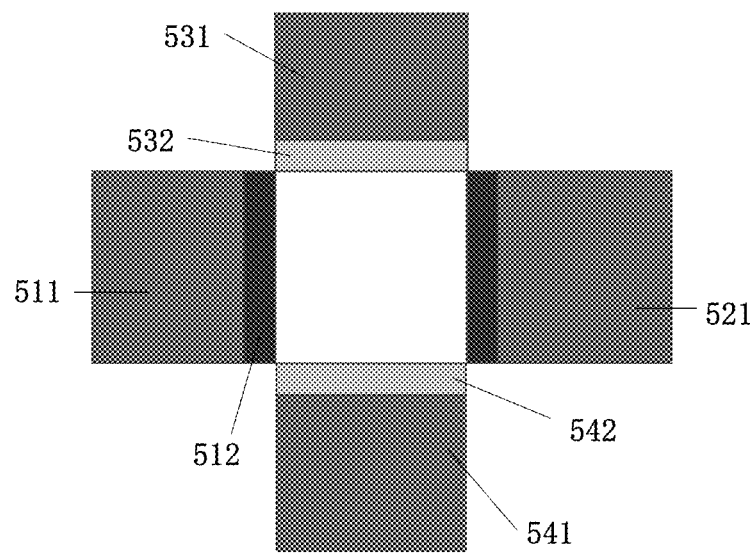
FIG. 46 is a schematic diagram of distribution of stacks according to an embodiment of the present disclosure.
Figure 47:
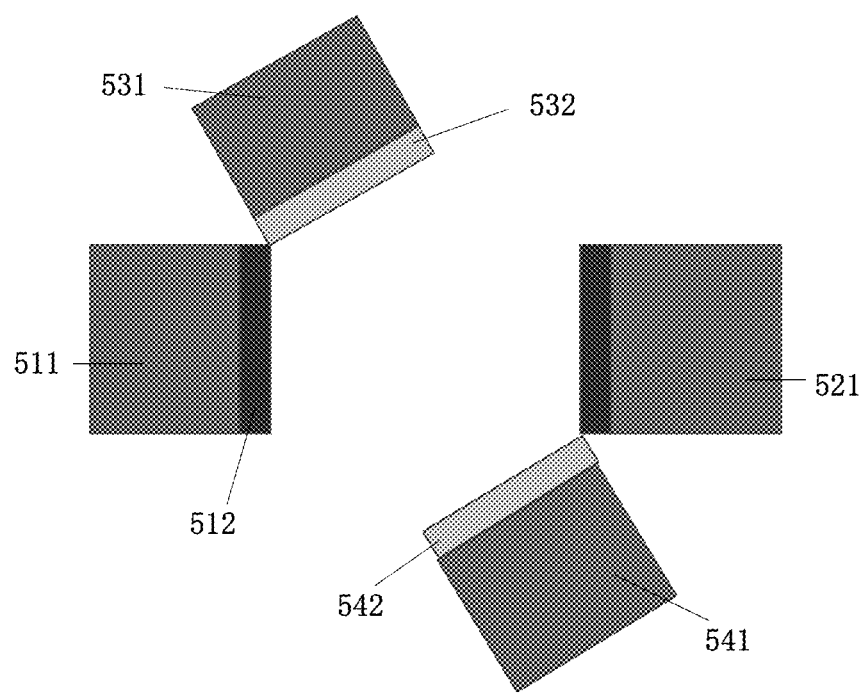
FIG. 47 is a schematic diagram of another distribution of stacks according to an embodiment of the present disclosure.

In the foregoing embodiment, it is taken as an example that there are the first stack and the second stack, which are different from each other in materials. The relevant drawings are for exemplary descriptions. In practice, there may further be a third stack and a fourth stack, which are both the first stack and the second stack in material. Reference is made to FIG. 46 and FIG. 47, which are schematic diagrams of stack distributions according to embodiments of the present disclosure. A first stack 511, a second stack 521, a third stack 531, and a fourth stack 541 are different from each other in material. It is appreciated that there may further be other stacks in another embodiment, which is not describe herein.

Positional relationship among the multiple stacks is not limited to which is shown in FIG. 46 and FIG. 47. For example, the multiple stacks may be arranged in an array, arranged in a staggered manner, or arranged with angle between adjacent stacks. A strain material layer may be formed on the first sidewall of each stack, to provide tensile stress or compressive stress for the channel layer, regardless of the positional relationship. Reference is further made to FIG. 46 and FIG. 47. A first strain material layer 512 is formed on the first sidewall of the first stack 511, a second strain material layer 522 is formed on the first sidewall of the second stack 521, a third strain material layer 532 is formed on the first sidewall of the third stack 531, and a fourth strain material layer 542 is formed on the first sidewall of the fourth stack 541.

The method for manufacturing the semiconductor device is provided according to the embodiment of the present disclosure. The dielectric layer may be formed on the substrate. The first stack and the second stack may be formed in the dielectric layer. The first stack and the second stack are different from each other in material. The first stack is formed in the first through hole running vertically through the dielectric layer, and includes the first doping layer, the first channel layer, and the second doping layer. The second stack is formed in the second through hole running vertically through the dielectric layer, and includes the third doping layer, the second channel layer and the fourth doping layer. Then, the first device may be formed from the first stack, and the second device may be formed from the second device.

In the first device, the first doping layer and the second doping layer serve as a source and a drain, and there is the vertical first channel layer between the source and the drain. In the second device, the third doping layer and the fourth doping layer serve as a source and a drain, and there is the vertical second channel layer between the source and the drain. Lengths of the first channel layer and the second channel layer are related to a thickness of the corresponding film layers. Costly high-precision etching is not necessary, and therefore a device with a small size and a high performance can be achieved with a simple process and a low cost. In addition, the substrate may be provided with the first stack and the second stack that are different in material, and hence the manufactured semiconductor device may include the first device and the second device that are different in material. Diversified device structures can be provided on requirement.

Based on the methods for manufacturing the semiconductor device according to the aforementioned embodiments, a semiconductor device is further provided according to an embodiment of the present disclosure. The semiconductor device includes a substrate, multiple stacks on the substrate, and an isolation structure among the multiple stacks. Each stack includes a first doping layer, a second doping layer, and a channel layer located between the first doping layer and the second doping layer. A cavity is located between the first doping layer and the second doping layer, at at least one sidewall of each stack. A first sidewall of said stack is contact with the isolation structure, the at least one sidewall does not include the first side wall, and the cavity is filled with a gate dielectric layer and a gate layer.

In one embodiment, the multiple stacks are identical in material. In such case, the semiconductor device may include stacked layers located on the substrate, and the stacked layers include a first doping material layer, a second doping material layer, and a channel material layer located between the first doping material layer and the second doping material layer. The stacked layers are provided with a first trench and a second trench, and the first trench is filled with the isolation structure. The first doping material layer, the channel material layer, and the second doping material layer are divided by the first trench into the first doping layers, the channel layers, and the second doping layers, respectively, in the multiple stacks. The at least one sidewall of each stack is adjacent to the second trench.

Reference is made to FIG. 18. In a semiconductor structure, the stacked layers formed by the first doping material layer, the channel material layer, and the second doping layer material is located on the substrate. There are the first trench and the second trench in the stacked layers. The isolation structure is formed in the first trench, dividing the stacked layers into the first doping layers, the channel layers, and the second doping layers. The channel layer is concave in the second trench, with respect to the first doping layer and the second doping layer. Hence, there is the cavity between the first doping layer and the second doping layer. A gate dielectric layer and a gate layer are formed in the cavity.

In one embodiment, the second trench separates the stacked layers into multiple separate structures. Each separate structure is divided by at least one sub-trench of the first trench, into multiple portions.

In one embodiment, the separate structure is divided by multiple sub-trenches of the first trench, and the multiple sub-trenches intersect with each other.

In one embodiment, the first doping layer, the channel layer and the second doping layer are made of: SiGe, Si, and SiGe, respectively; Si, SiGe, and Si, respectively; or Ge, GeSn, and Ge, respectively.

In one embodiment, a buffer layer is formed between the substrate and the first doping material layer.

In an embodiment, an intrinsic layer corresponding to a material of the first doping material layer is formed between the first doping material layer and the channel material layer, and between the first doping material layer and the gate dielectric layer. An intrinsic layer corresponding to a material of the second doping layer is formed between the channel material layer and the second doping material layer, and between the gate dielectric material layer and the second doping material layer.

In one embodiment, the isolation structure includes a strain material layer, which is configured to provide compressive stress or tensile stress for the channel layer.

In another embodiment, the multiple stacks are different in materials. The semiconductor device further includes a dielectric material on the substrate. The multiple stacks include at least a first stack and a second stack. The first stack and the second stack are located in a first through hole and a second through hole, respectively, in the dielectric material. The first stack and the second stack are different from each other in materials. The dielectric material serves as the isolation structure.

Reference is made to FIG. 44. The semiconductor device includes the dielectric material located on the substrate. There are the first stack and the second stack in the dielectric material. The first stack is formed in the first through hole running vertically through the dielectric material, and include the first doping layer, the first channel layer and the second doping layer. The second stack is formed in the second through hole running vertically through the dielectric material, and include the third doping layer, the second channel layer and the fourth doping layer. The first stack and the second stack different from each other in material. The dielectric material between the first stack and the second stack serves as the isolation structure.

The first device is based on the first stack. The first device includes the first doping layer, the first channel layer, and the second doping layer, and further includes the first gate dielectric layer and the first gate layer within the first cavity. The first channel layer is concave at the at least one side wall of the first stack, with respect to the first doping layer and the second doping layer, so as to from the first cavity located between the first doping layer and the second doping layer. The second device is based on the second stack. The second device includes the third doping layer, the second channel layer, and the fourth doping layer, and further includes the second gate dielectric layer and second first gate layer within the second cavity. The second channel layer is concave at the at least one side wall of the second stack, with respect to the third doping layer and the fourth doping layer, so as to from the second cavity located between the third doping layer and the fourth doping layer.

In one embodiment, the first doping layer, the first channel layer, and the second doping layer are made of: SiGe, Si, and SiGe, respectively; Si, SiGe, and Si, respectively; or Ge, GeSn, and Ge, respectively. The third doping layer, the second channel layer, and the fourth doping layer are made of: SiGe, Si, and SiGe, respectively; Si, SiGe, and Si, respectively; or Ge, GeSn, and Ge, respectively.

In one embodiment, a buffer layer is formed between the substrate and the first doping layer, and/or another buffer layer is formed between the substrate and the third doping layer.

In one embodiment, an intrinsic layer corresponding to a material of the first doping layer is formed between the first doping layer and the first channel layer, and an intrinsic layer corresponding to a material of the second doping layer is formed between the first channel layer and the second doping layer. In one embodiment, an intrinsic layer corresponding to a material of the third doping layer is formed between the third doping layer and the second channel layer, and an intrinsic layer corresponding to a material of the fourth doping layer is formed between the second channel layer and the fourth doping layer.

In one embodiment, an insulation layer is located between the first stack and the second stack. The insulation layer includes one or both of a first strain material layer and a second strain material layer. The first strain material layer is located on the first sidewall of the first stack, and is configured to provide compressive stress or tensile stress for the first channel layer. The second strain material layer is located on the first sidewall of the second stack, and is configured to provide compressive stress or tensile stress for the second channel layer.

The embodiments of the present disclosure are described in a progressive manner, and each embodiment places emphasis on the difference from other embodiments. Therefore, one embodiment can refer to other embodiments for the same or similar parts. Since the devices disclosed in the embodiments correspond to the methods disclosed in the embodiments, the description of the devices is simple, and reference may be made to the relevant part of the methods.

The foregoing embodiments are only preferred embodiments of the present disclosure, and do not limit the present disclosure in any form. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure

The invention claimed is:

1. A method for manufacturing a semiconductor device, comprising:
forming, on a substrate, a plurality of stacks and an isolation structure among the plurality of stacks, wherein each stack comprises a first doping layer, a second doping layer, and, a channel layer located between the first doping layer and the second doping layer;
for each stack,
etching the channel layer laterally from at least one sidewall of said stack, to form a cavity located between the first doping layer and the second doping layer, and
forming a gate dielectric layer and a gate layer in the cavity;
wherein a first sidewall of said stack is contact with the isolation structure, the at least one sidewall does not comprise the first sidewall, and a part of the channel layer remains at the first sidewall of said stack after the etching.

2. The method according to claim 1, wherein forming the plurality of multiple stacks and the isolation structure among the plurality of stacks on the substrate comprises:
forming, on the substrate, a first doping material layer, a second doping layer material, and a channel material layer located between the first doping material layer and the second doping material layer;
etching the first doping material layer, the channel material layer, and the second doping material layer, to form a first trench; and
forming the isolation structure in the first trench.

3. The method according to claim 2, wherein etching the channel layer laterally comprises:
etching the first doping material layer, the channel material layer and the second doping material layer, to form a second trench, wherein the second trench exposes the at least one sidewall of said stack; and
etching the channel layer laterally via the second trench.

4. The method according to claim 3, wherein after forming the gate dielectric layer and the gate layer in the cavity, the method further comprises:
filling the second trench with a dielectric material.

5. The method according to claim 1, wherein forming the plurality of multiple stacks and the isolation structure among the plurality of stacks on the substrate comprises:
forming a dielectric layer on the substrate;
forming, in the dielectric layer, multiple through holes that run vertically through the dielectric layer; and
forming a stack in each through hole;
wherein the dielectric layer serves as the isolation structure among the plurality of stacks, the plurality of stacks comprises at least a first stack and a second stack, and the first stack and the second stack are different in material.

6. The method according to claim 5, wherein etching the channel layer laterally comprises:
etching the dielectric layer to form a third trench, wherein the third trench exposes the at least one sidewall of said stack; and
etching the channel layer laterally via the third trench.

7. The method according to claim 6, wherein after forming the gate dielectric layer and the gate layer in the cavity, the method further comprises:
filling the third trench with a dielectric material, wherein the dielectric material corresponds to said stack.

8. The method according to claim 3, wherein:
the second trench is formed and another isolation structure is formed in the second trench, before the first trench is formed; and
the another isolation structure is removed from the second trench, after forming the isolation structure in the first trench.

9. The method according to claim 3, wherein
the second trench divides the first doping material layer, the channel material layer, and the second doping material layer into a plurality of separate structures; and
each of the plurality of separate structures is divided into a plurality of portions by the first trench.

10. The method according to claim 9, wherein one of the plurality of separate structures is divided into the plurality of portions by a plurality of sub-trenches of the first trench, wherein the plurality of sub-trenches intersects with each other.

11. The method according to claim 1, wherein etching the channel layer laterally comprises:
performing a plurality of oxidation-removal processes;
wherein each of the plurality of oxidation-removal process comprises:
oxidizing the channel layer, to form an oxide layer on an exposed surface of the channel layer; and
removing the oxide layer.

12. The method according to claim 1, wherein for each stack, the first doping layer, the channel layer and the second doping layer are made of:
SiGe, Si, SiGe, respectively;
Si, SiGe, Si, respectively; or
Ge, GeSn, Ge, respectively.

13. The method according to claim 1, wherein a buffer layer is formed between the substrate and the plurality of stacks.

14. The method according to claim 1, wherein:
an intrinsic layer corresponding to a material of the first doping layer is formed between the first doping layer and the channel layer, and
an intrinsic layer corresponding to a material of the second doping layer is formed between the channel layer and the second doping layer.

15. The method according to claim 1, wherein:
in a case that the channel layers in the plurality of stacks are made of a same material, the isolation structure comprises a strain material layer, and the strain material layer is configured to provide compressive stress or tensile stress for the channel layer of each stack; and
in a case that the channel layers in the plurality of stacks are made of a plurality of materials, the isolation structure comprises a plurality of strain material layers, and the plurality of strain layers are configured to provide compressive stress or tensile stress for the plurality of materials, respectively.

16. The method according to claim 1, wherein forming the gate dielectric layer and the gate layer in the cavity comprises:
   depositing the gate dielectric layer and the gate layer, and removing the gate dielectric layer and the gate layer that are located outside the cavity.

\* \* \* \* \*